US007161386B2

(12) United States Patent
Takiba et al.

(10) Patent No.: US 7,161,386 B2
(45) Date of Patent: *Jan. 9, 2007

(54) SIGNAL-LEVEL CONVERTER

(75) Inventors: Akira Takiba, Kanagawa (JP); Toru Fujii, Kanagawa (JP); Tetsuyo Shigehiro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/143,994

(22) Filed: Jun. 3, 2005

(65) Prior Publication Data

US 2005/0219924 A1 Oct. 6, 2005

Related U.S. Application Data

(63) Continuation of application No. 10/411,220, filed on Apr. 11, 2003, now Pat. No. 6,933,749.

(30) Foreign Application Priority Data

Feb. 12, 2003 (JP) .............................. 2003-033757

(51) Int. Cl.
*H03K 19/094* (2006.01)
(52) U.S. Cl. .............................. 326/68; 326/80; 326/81
(58) Field of Classification Search .................. 326/68, 326/80–81, 86; 327/333
See application file for complete search history.

(56) References Cited

U.S. PATENT DOCUMENTS

| 4,080,539 | A | | 3/1978 | Stewart |
| 4,988,894 | A | | 1/1991 | Takiba et al. |
| 5,442,307 | A | | 8/1995 | Shigehara et al. |
| 5,530,672 | A | | 6/1996 | Konishi |
| 5,610,544 | A | * | 3/1997 | Aoki ........................... 327/198 |
| 5,742,183 | A | | 4/1998 | Kuroda |
| 6,781,415 | B1 | * | 8/2004 | Clark et al. .................... 326/81 |
| 6,933,749 | B1 | * | 8/2005 | Takiba et al. .................. 326/81 |
| 2003/0076149 | A1 | | 4/2003 | Haga |
| 2003/0098714 | A1 | | 5/2003 | Clark et al. |

FOREIGN PATENT DOCUMENTS

JP 6-120801 4/1994

(Continued)

*Primary Examiner*—Anh Q. Tran
(74) *Attorney, Agent, or Firm*—Oblon, Spivak, McClelland, Maier & Neustadt, P.C.

(57) ABSTRACT

A signal-level converter is provided between a first terminal and a second terminal. The first terminal is connected to a first logic circuit operating at a first supply voltage higher than a given reference voltage. The second terminal is connected to a second logic circuit operating at a second supply voltage higher than the first supply voltage. The signal-level converter has a switching transistor that forms a current passage between the first and the second terminals in response to a control signal supplied to a gate of the switching transistor and a bus-hold circuitry, provided between the switching transistor and either the first or the second terminal as the output terminal, the other being the input terminal, and configured to convert a voltage level of a signal transferred via the switching transistor into another voltage level at the output terminal. The bus-hold circuitry may have two bus-hold circuits between the input and the output terminals, for two-way signal transfer. The bus-hold circuitry may have one bus-hold circuit between the switching transistor and the output terminal, for one-way signal transfer. These circuit arrangements offer reduced chip size and simplified control operations for accurate output-terminal voltages. Moreover, the arrangements omit one direction-switching terminal in two-way signal transfer.

19 Claims, 18 Drawing Sheets

| | FOREIGN PATENT DOCUMENTS | | JP | 2000-269799 | 9/2000 |
|---|---|---|---|---|---|
| JP | 7-79151 | 3/1995 | | | |
| JP | 8-335126 | 12/1996 | * cited by examiner | | |

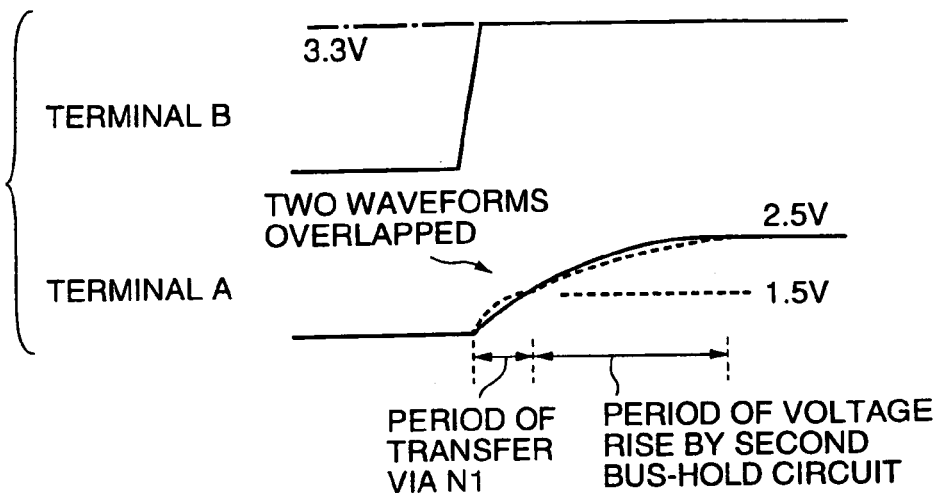
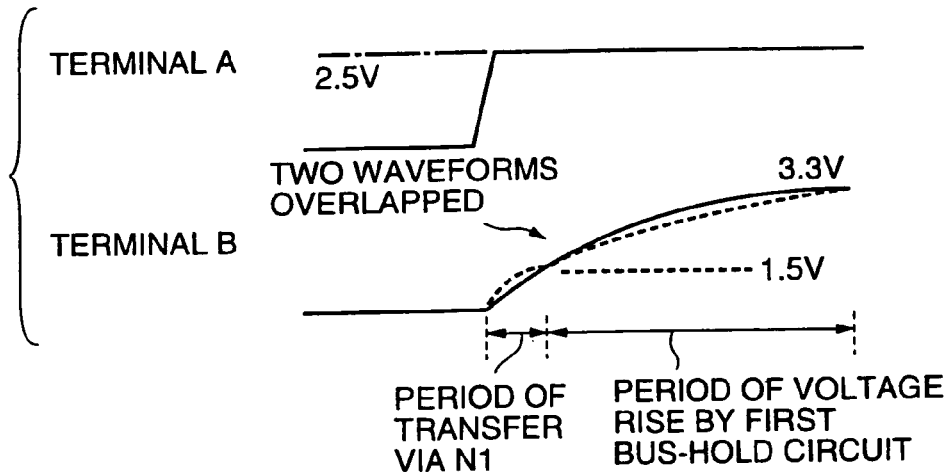

SIGNAL-LEVEL CONVERTER

CROSS REFERENCE TO RELATED APPLICATIONS

This continuation application is based upon and claims the benefit of priority under 35 USC §120 from U.S. application Ser. No. 10/411,220 filed Apr. 11, 2003 now U.S. Pat. No. 6,933,749, the entire contents of which are incorporated by reference. This application claims benefit of priority under 35 USC § 119 to Japanese Patent Application No. 2003-33757, filed on Feb. 12, 2003, the entire contents of which are incorporated by reference.

BACKGROUND OF THE INVENTION

The present invention relates to a signal-level converter, particularly, provided between logic circuits operating at different supply-voltage levels.

Any systems installing CPU (Central Processing Unit.), usually, contain a lot of bus (signal) lines through which data are transferred between CPU and peripheral devices connected to the bus (signal) lines, like branches.

Micro-fabrication processes and/or low power supply allow for low CPU power consumption which may otherwise become higher as CPU processing speed becomes higher.

On the contrary, low power consumption has not been achieved enough so far for the peripheral devices connected to CPU, such as, buttery-powered devices; for compatibility with other devices. Such buttery-powered devices are, for example, mobile phones and PDA (Personal Digital Assistant).

There is a strong demand for low CPU power consumption for long use of buttery-powered devices. Such demand, however, cannot be met due to the necessity of compatibility of bus-connected peripheral devices.

Signal inputs at voltage level different from supply-voltage level could cause increase in system current consumption, device malfunction or device damages.

Level-converting integrated circuits are thus required to meet such demand, such as, a 2-power-level converter, shown in FIG. 20.

A system 1, such as PDA, shown in FIG. 20 is equipped with a VccA circuit 2 operating at a supply-voltage level A and a VccB circuit 3 operating at a supply-voltage level B.

In detail, the system 1 is equipped with a first input buffer 5, a first (A to B)-logic circuit 6, a level shifter 7 for supply-voltage-level conversion and a first output buffer 8, for signal transfer from terminals A1 to B1, as shown by an arrow 4.

The system 1 is equipped further with a second input buffer 11, a second (B to A)-logic circuit 12 and a second output buffer 13, for signal transfer from the terminals B1 to A1, as shown by an arrow 10.

The signal-transfer operation is switched by a control circuit 9. In detail, the control circuit 9 switches signal transfer shown by the arrows 4 and 10, in response to a direction-switching signal at a terminal DIR and an operation signal at another terminal *OE. The sign "*" for a signal *OE means that the signal has been inverted.

The known system shown in FIG. 20 operates at two supply-voltage levels VccA and VccB (VccA<VccB). For example, the VccA circuit 2 operates at a supply voltage of 2.5 volts for signal transfer from the terminals A1 to B1 whereas the VccB circuit 3 at a supply voltage of 3.3 volts for signal transfer from the terminals B1 to A1.

In signal transfer from the terminals A1 to B1, a signal input at the terminal A1 is supplied to the level shifter 7 through the first input buffer 5 and the first (A to B)-logic circuit 6. The input signal is subjected to level conversion from VccA to VccB at the level shifter 7, thus a VccB-level signal being output at the terminal B1.

The level shifter 7 is provided for completely turning off P-channel transistors in the first output buffer 8. If the level shifter 7 is not provided, however, gate-to-source voltages Vgs will not become 0 volts for the P-channel transistors, thus the transistors remaining on unchanged, and hence suffering from static currents passing therethrough.

On the contrary, such level shifter is not necessary between the second (B to A)-logic circuit 12 and the second output buffer 13, for signal transfer from the terminals B1 to A1. In other words, an signal input at the terminal B1 is converted into a VccA-level signal at the terminal A1 through the second input buffer 11, the second (B to A)-logic circuit 12 and the second output buffer 13.

Operation of the known system (FIG. 20) will further be explained with reference to FIG. 21.

In FIG. 21, the terminals A and B will be in a high-impedance state when the terminal *OE is set at a VccB level. On the contrary, the terminals A and B will become the input and the output terminals, or vice versa when the terminal *OE is set at a ground (GND) level.

Moreover, the terminals A and B will become the input and the output terminals, respectively, when a terminal DIR is set at the VccB level. Contrary to this, the terminals A and B will become the output and the input terminals, respectively, when the terminal DIR is set at the GND level.

Explained blow is an operation of the known system when an input signal is supplied at the terminal A and output at the terminal B (i. e. *OE=GND, DIR=VccB).

When a VccA-level signal is input at the terminal A, the VccA-level appears at a node α to turn on an N-channel transistor N1 and a P-channel transistor P2 while an N-channel transistor N2 is turned of and hence a P-channel transistor P1 is also turned off, thus a VccB-level signal appearing at a node β.

The VccB-level signal is output at the terminal B through the first output buffer 8, thus level conversion from the VccA to VccB being enabled.

Nevertheless, the level shifter 7 in the first known two-way system consists of several components, thus the system becoming bulk in chip size.

Moreover, signal transfer from the terminals A to B, or vice versa, is decided under the input of a direction-switching signal at the terminal DIR, which causes complexity of control.

Not only the two-way system shown in FIGS. 20 and 21, but also a one-way system shown in FIGS. 22 to 24 is a bus system operating at different supply-voltage levels.

The second known one-way system will be explained with reference to FIGS. 22 to 24.

The one-way system has the same circuitry as the two-way system except that the former has no terminal DIR for supplying a direction-switching signal.

Elements in the second known one-way system that are the same or analogous to the elements in the first known two-way system are referenced by the same reference numerals and will not be explained.

The operation of the one-way system shown in FIG. 22 is the same as that in signal transfer from the terminals A to B, or vice versa in the two-way system.

The one-way system with no terminal DIR is simple in control compared to the two-way system, but, still complex in circuitry, thus being bulk in chip size the same as the two-way system.

A known one-way system performs level conversion with an N-channel transistor only, as shown in FIG. 23. A signal input at a terminal A connected to a first logic circuit operating at a first supply-voltage level is converted for its voltage level by a level shifter 7 through input buffer and (A to B)-logic circuits (not shown). The level-converted signal is then output to a second logic-circuit operating at a second supply-voltage level via a terminal B.

The control circuit 9 supplies a control signal to the gate of an N-channel transistor N1 in the level shifter 7, based on a *OE signal input via a terminal *OE.

In detail, a VccB-level *OE signal input at the terminal *OE turns off the N-channel transistor N1 to isolate the terminals A and B from each other. On the contrary, a GND-level *OE signal allows signal transfer between the terminals A and B.

The operation below is performed when the terminal B is switched to the VccB level from the GND level whereas the terminal A is held at the GND level while the N-channel transistor N1 is on in response to the GND level at the terminal *OE.

A VccB-level signal input to the terminal B is transferred to the terminal A via the N-channel transistor N1 that has been turned on due to the supply of a VccB-level signal to the gate, thus a (VccB−VthN)-level signal appearing at the terminal A (VthN being a threshold level of the transistor N1).

For example, VccB=3.3 volts, VccA=2.5 volts and VthN=1.0 volts give VccB−VthN=3.3−1.0=2.3 volts at the terminal A.

The second known one-way system, however, suffers from output-voltage fluctuation due to variation in threshold level VthN of the transistor N1. For example, variation of ±0.2 volts in threshold level VthN causes output-voltage fluctuation in the range from 2.1 to 2.5 volts. The lowest output voltage of 2.1 volts is 0.4 volts lower than VccA of 2.5 volts, thus causing a static current passing through the first-stage circuit component connected to the terminal A.

Such a static current passing through the first-stage component will be discussed with reference to FIG. 24.

The first-stage circuit component of the first logic circuit is an inverter in FIG. 24.

In a one-way system from the terminals B to A, an output signal of 2.1 volts at the terminal A turns on a transistor N2 of the inverter. Also turned on, but not completely, is a transistor P1 of the inverter due to a gate-to-source voltage Vgs of 0.4 volts, the difference between 2.5 volts (VccA level) and 2.1 volts. The transistor P1 causes flow of static current passing through the transistor N2.

On the contrary, in a one-way system from the terminals A to B, voltages appearing at the terminal A is 2.5 volts and 3.3−1=2.3 volts (gate voltage to the transistor N1) at the terminal B, respectively, like the one-way system from the terminals B to A.

Another first-stage circuit component, if connected to the terminal B, will have a gate-to-source voltage Vgs of 3.3−2.3=1 volts to its P-channel transistor, thus suffering from more static current.

As discussed above, the signal-level converter having an N-channel transistor only is simple in structure, but, still disadvantageous in the effects of threshold-voltage fluctuation in the N-channel transistor and also static current passing through the next-stage circuitry.

In summary, the known signal-level converter used in the two-way system described above requires many components, thus becoming bulk in chip size. In addition, the terminal DIR for deciding signal-transfer (input/output) direction causes complexity of control.

The one-way system does not require the terminal DIR, thus not so complex in control compared to the two-way system, but, still becoming bulk in chip size when the known signal-level converter is used.

Moreover, a switching transistor for the known signal-level converter in the one-way system causes flow of static current to pass through transistors, etc., of the first-stage circuit component due to variation in threshold level of the switching transistor.

SUMMARY OF THE INVENTION

A purpose of the present invention is to provide a signal-level converter, achieving reduction of chip size when the signal-level converter is integrated into a chip, simplified control and also accurate voltage output at output terminals.

In order to fulfill the purpose, a signal-level converter according to a first aspect of the present invention is provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; a first bus-hold circuit, provided between the switching transistor and the second terminal, and configured to convert a voltage level of a signal transferred via the switching transistor into another voltage level at the second terminal when the first terminal is an input terminal whereas the second terminal is an output terminal; and a second bus-hold circuit, provided between the switching transistor and the first terminal, and configured to convert a voltage level of a signal transferred via the switching transistor into another voltage level at the first terminal when the second terminal is an input terminal whereas the first terminal is an output terminal.

Moreover, a signal-level converter according to a second aspect of the present invention is provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; a first bus-hold circuit including a series connection of a first inverter and a second inverter connected in parallel between the switching transistor and the second terminal; and a second bus-hold circuit including a series connection of a third inverter and a fourth inverter connected in parallel between the switching transistor and the first terminal.

Moreover, a signal-level converter according to a third aspect of the present invention is provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; a first bus-hold circuit including a series connection of a first clocked inverter and a second inverter connected in parallel between the switching transistor and the second terminal; and a second bus-hold circuit including a series connection of a second clocked inverter and a fourth inverter connected in parallel between the switching transistor and the first terminal.

Moreover, a signal-level converter according to a fourth aspect of the present invention is provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; a first bus-hold circuit including a series connection of a first clocked inverter and a first NAND-logic circuit connected in parallel between the switching transistor and the second terminal; and a second bus-hold circuit including a series connection of a second clocked inverter and a second NAND-logic circuit connected in parallel between the switching transistor and the first terminal.

Moreover, a signal-level converter according to a fifth aspect of the present invention is provided between a first terminal and a second terminal, for one-way signal transfer from either the first or the second terminal to the other terminal, the first terminal being connected to a first logic circuit operating at a first supply voltage higher than a given reference voltage, the second terminal being connected to a second logic circuit operating at a second supply voltage higher than first power-supply voltage, the signal-level converter comprising: a switching transistor that forms a current passage between the first and the second terminals in response to a control signal supplied to a gate of the switching transistor; and a bus-hold circuit, provided between the switching transistor and an output terminal that is either the first or the second terminal, the other terminal being an input terminal, and configured to convert a voltage level of a signal transferred via the switching transistor into another voltage level at the output terminal.

Furthermore, a signal-level converter according to a sixth aspect of the present invention is provided between a first terminal and a second terminal, for one-way signal transfer from either the first or the second terminal to the other terminal, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; and a bus-hold circuit including a series connection of a first inverter and a second inverter, provided between the switching transistor and an output terminal that is either the first or the second terminal, the other terminal being an input terminal.

Furthermore, a signal-level converter according to a seventh aspect of the present invention is provided between a first terminal and a second terminal, for one-way signal transfer from either the first or the second terminal to the other terminal, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; and a bus-hold circuit including a series connection of a first clocked inverter and a second inverter, provided between the switching transistor and an output terminal that is either the first or the second terminal, the other terminal being an input terminal.

Moreover, a signal-level converter according to an eighth aspect of the present invention is provided between a first terminal and a second terminal, for one-way signal transfer from either the first or the second terminal to the other terminal, the first terminal being connected to a first logic circuit operating at a first supply voltage higher than a given reference voltage, the second terminal being connected to a second logic circuit operating at a second supply voltage higher than the first supply voltage, the signal-level converter comprising: a switching transistor that forms a current passage between the first and the second terminals in response to a control signal supplied to a gate of the switching transistor; and a bus-hold circuit including a series connection of a first clocked inverter and a second NAND-logic circuit, provided between the switching transistor and an output terminal that is either the first or the second terminal, the other terminal being an input terminal.

BRIEF DESCRIPTION OF DRAWINGS

FIG. 7 shows signal-transfer characteristics from terminals B to A in the signal-level shifter of the fourth embodiment;

FIG. 8 shows signal-transfer characteristics from the terminals A to B in the signal-level shifter of the fourth embodiment;

DETAILED DESCRIPTION OF EMBODIMENTS

Several embodiments of signal-level converter according to the present invention will be disclosed with reference to the attached drawings.

Figure 1:
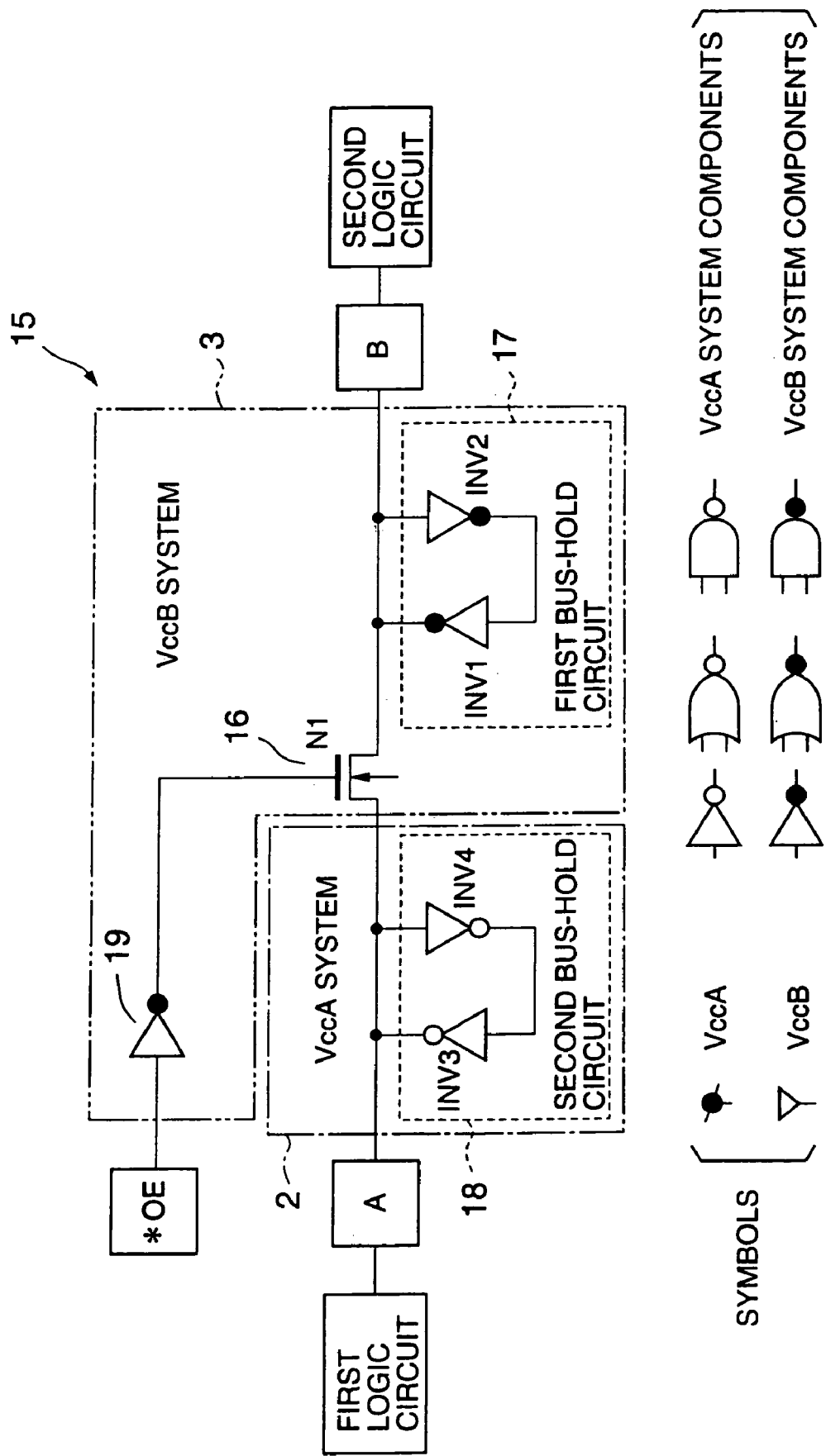
FIG. 1 shows a logic circuit diagram of a first embodiment of signal-level shifter according to the present invention.
Figure 2:
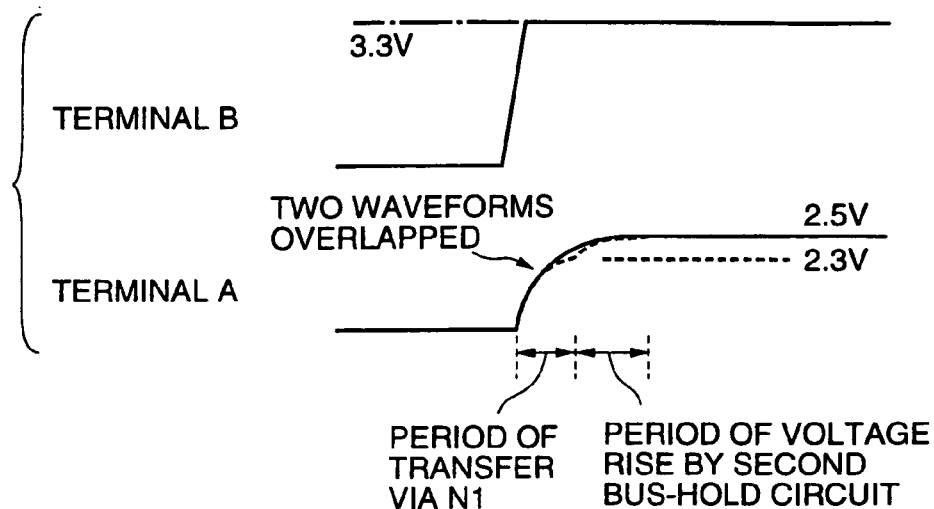
FIG. 2 shows signal-transfer characteristics from terminals B to A in the signal-level shifter of the first embodiment.
Figure 3:
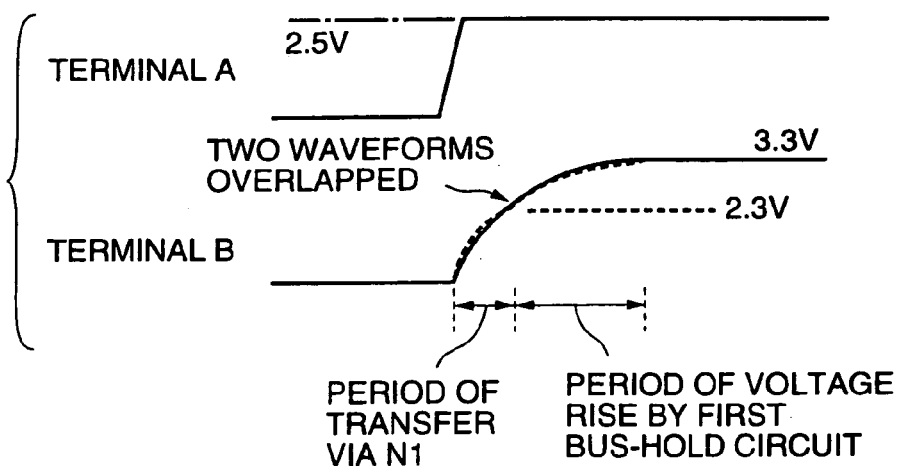
FIG. 3 shows signal-transfer characteristics from the terminals A to B in the signal-level shifter of the first embodiment.

Disclosed first with reference to FIGS. 1 to 3 is a first embodiment of the present invention.

FIG. 1 shows an outline circuit configuration of the first embodiment of signal-level converter. A signal-level converter 15 (FIG. 1) is located between a first terminal A connected to a first logic circuit operating at a first supply voltage VccA higher than a given reference voltage and a second terminal B connected to a second logic circuit operating at a second supply voltage VccB higher than the first supply voltage VccA, for two-way signal transfer between these terminals.

The signal-level converter 15 is equipped with a switching transistor 16 that forms a current passage between the terminals A and B under control by a control signal supplied to its gate; a first bus-hold circuit 17 provided between the switching transistor 16 and the second terminal B for converting a voltage level of a signal transferred via the transistor 16 into another level at the terminal B, or the second supply-voltage (VccB) level, when the terminals A and B are input and output terminals, respectively; and a second bus-hold circuit 18 provided between the switching transistor 16 and the first terminal A, for converting a voltage level of a signal transferred via the transistor 16 into another level at the terminal A, or the first supply-voltage (VccA) level when the terminals A and B are output and input terminals, respectively.

In addition to the first and the second terminals A and B, the signal-level converter 15 has a control terminal *OE for control-signal input. The switching transistor 16 is an N-channel transistor N1, the gate of which is connected to the control terminal *OE and the source and drain of which are connected to the terminals A and B, respectively. While a control signal is being supplied to the gate, the switching transistor 16 is turned on to form a current passage between the terminals A and B for a signal supplied to the terminal A or B.

A signal supplied to the control terminal *OE is inverted by a control circuit 19 having an inverter, and supplied to the gate of the switching transistor 16, as a control signal OE.

As shown in FIG. 1, in this first embodiment, the second bus-holding circuit 18 is only involved in a first supply-voltage (VccA) system 2 whereas the first bus-holding circuit 17 and the control circuit 19 are involved in a second supply-voltage (VccB) system 3.

As disclosed, the level-converter 15 as the first embodiment of the present invention is equipped with the first bus-holding circuit 17 and the second bus-holding circuit 18, in use for two-way logic systems.

The first bus-holding circuit 17 has a series connection of inverters INV1 and INV2 connected in parallel between the transistor N1 and the second terminal B. The second bus-holding circuit 18 also has a series connection of inverters INV3 and INV4 connected in parallel between the transistor N1 and the first terminal A.

Disclosed next are operations of the signal-level converter 15 (first embodiment) operating, for example, at 2.5 volts (the first supply voltage VccA) and 3.3 volts (the second supply voltage VccB).

The signal-level converter 15 basically operates as follows:

The second supply voltage VccB given at the terminal *OE turns off the switching transistor 16 to isolate the terminals A and B form each other. On the contrary, a reference level, such as, a GND level (0 volts) given at the terminal *OE allows signal transfer between the terminals A and B.

Disclosed below in detail is an operation of the signal-level converter 15 in which the second terminal B is switched from the GND level to the VccB level whereas the first terminal A is set at the GND level while the N-channel transistor N1 (the switching transistor 16) is on in response to the GND level at the terminal *OE.

A VccB-level control signal is supplied to the gate of the N-channel transistor N1 to turn on the transistor N1. Thus, a VccB-level signal supplied at the second terminal B allows a voltage (VccB–VthN) appearing at the first terminal A. The voltage VthN is the threshold level of the transistor N1.

For example, VccB=3.3 volts, VccA=2.5 volts and VthN=1.0 volts give BccB–VthN=3.3–1.0=2.3 volts at the terminal A. The transferred voltage of 2.3 volts is inverted by the inverter INV4 of the second bus-hold circuit 18. Thus, the inverter INV4 outputs the GND level and then the inverter INV3 outputs 2.5 volts. The first terminal A therefore shows voltage increase to 2.5 volts, as shown in FIG. 2.

On the contrary, the first supply voltage VccA (2.3 volts) supplying at the first terminal A allows a voltage of 3.3–1.0=2.3 volts appearing the second terminal B. The voltage of 2.3 volts is inverted by the inverter INV2 of the first bus-hold circuit 17. Thus, the inverter INV2 outputs the GND level and then the inverter INV1 outputs 3.3 volts. In other words, the increase of 1.0 volts from 2.3 volts to 3.3 volts is done by the inverter INV1, as shown in FIG. 3. Therefore, 3.3 volts as the second supply voltage VccB appear at the second terminal B.

Disclosed next is another operation of the signal-level converter 15 in which the second terminal B is switched from the second supply-voltage (VccB) level to the GND (reference) level whereas the first terminal A is held at the first supply-voltage (VccA) level.

The transistor N1 is completely turned on and remains unchanged until the voltage level at the first terminal A is decreased to the GND level, the same as the second terminal B.

This is also true in which first terminal A is switched from the first supply-voltage (VccA) level to the GND (reference) level whereas the second terminal B is held at the second supply-voltage (VccB) level.

It is understood that GND-level transfer is achieved by the transistor N1 only.

The second supply-voltage level at the control terminal *OE (*OE=VccB) turns off the transistor N1 to isolate the terminals A and B from each other, thus signal transfer being not enable while the former state (before isolation) is being held by the bus-hold circuits 17 and 18.

As disclosed, the combination of the transistor N1 functioning as a switch, the first and the second bus-hold circuits 17 and 18 provided between two different supply-voltage levels achieves level conversion with simplified circuit configuration, thus reducing the chip size.

The transistor N1 is just a switching transistor that requires an ON/OFF signal (the control signal *OE in FIG. 1). This means that the signal-level converter 15 shown in FIG. 1 does not need such terminal DIR for a direction-switching signal in the known two-way system, thus decrease in the number of terminals for two-way logic circuitry being achieved.

The bus-hold circuits 17 and 18 convert the level of the signal transferred through the transistor N1 into the supply-voltage levels at the terminals A and B, respectively. Thus, transistors used for the circuits 17 and 18 may be small in size (performance), thus reduction of chip size being achieved.

The signal levels at the terminals A and B surely reach the supply-voltage levels VccA and VccB, respectively, thus no static current passing through the circuit components closest to the terminals A and B, hence decrease in power consumption being achieved.

The signal-level converter 15 shown in FIG. 1 is equipped with the N-channel transistor N1 as the switching transistor 16. Not only that, a P-channel transistor may be used as the switching transistor 16. The inverters INV1 and INV2, and INV3 and INV4 for the bus-hold circuits 17 and 18, respectively, may also be made up of N- and/or P-channel transistors.

Moreover, each of the bus-hold circuits 17 and 18 consists of series-connected two inverters provided in parallel between the switching transistor 16 and the terminal B or A.

Figure 4:
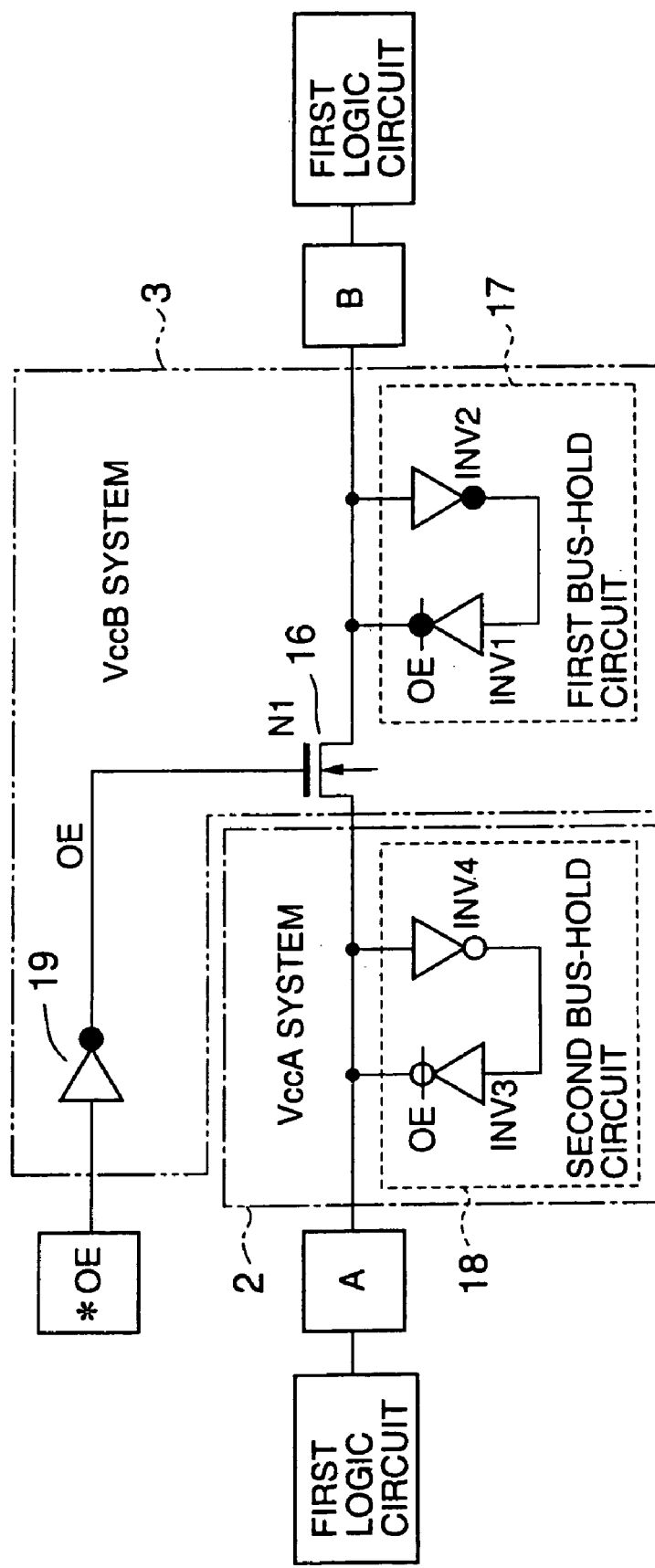
FIG. 4 shows a logic circuit diagram of a second embodiment of signal-level shifter according to the present invention.

Not only that, the inverter INV1 in the first bus-hold circuit 17 and also the inverter INV3 in the second bus-hold circuit 18 may be clocked inverters controlled by the control signal *OE, like a second embodiment of signal-level converter shown in FIG. 4.

The second embodiment with the clocked inverters INV1 and INV3 suffers no currents flowing at the terminals A and B while the N-channel transistor N1 (switching transistor 16) is off, thus achieving reduction of current consumption.

The terminals A and B will be in a high-impedance state while the N-channel transistor N1 is off.

Nevertheless, the second embodiment shown in FIG. 4 is still disadvantageous in that the inverters INV2 and INV4 allow flow of operating current when bus signals vary at the terminals A and B even while the N-channel transistor N1 is off, thus causing current consumption. Thus, the second embodiment cannot achieve high reduction of current consumption.

Figure 5:
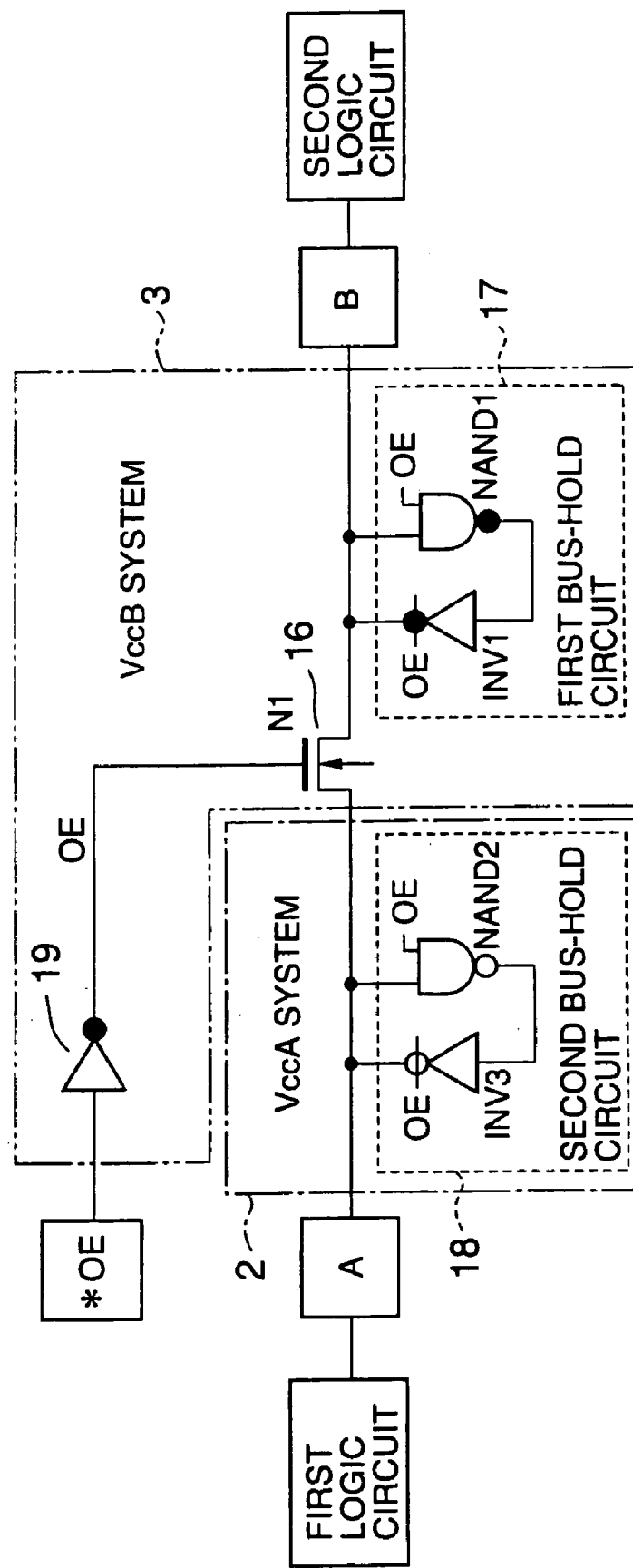
FIG. 5 shows a logic-circuit diagram of a third embodiment of signal-level shifter according to the present invention.

To achieve high reduction of current consumption, the inverters INV2 and INV4 may be replaced with first and second 2-input NAND-logic circuits NAND1 and NAND2, respectively, such as shown in FIG. 5 (third embodiment). One of the two inputs to each of the NAND-logic circuits NAND1 and NAND2 is connected to the terminals B and A, respectively. The other terminal of each NAND-logic circuit is given a control signal *OE.

The first and second bus-hold circuits 17 and 18 in third embodiment of signal-level converter can be locked while the transistor N1 is off, thus further reduction of current consumption being achieved.

In detail, when the transistor N1 is turned off by a control signal OE, the clocked inverters INV1 and INV2 and the NAND-logic circuits NAND1 and NAND2 are also turned off by the control signal *OE, thus causing no flow of operating current even when bus signals vary at the terminals A and B. This mechanism completely avoids profitless current consumption.

The control terminal *OE is involved in the second supply-voltage (VccB) system 3 in the first, the second and the third embodiments. Not only that, another arrangement can be made, which is employed in a fourth embodiment of signal-level converter shown in FIGS. 6 to 8.

Figure 6:
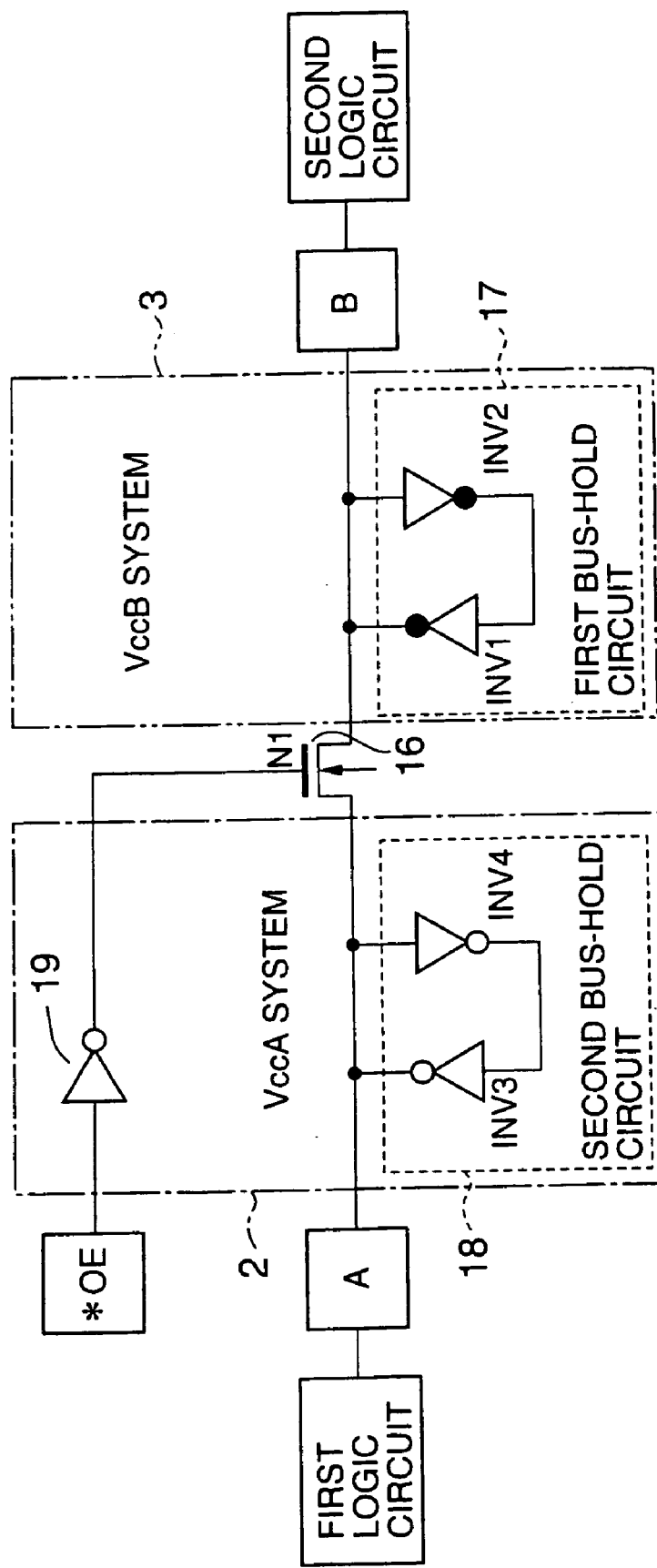
FIG. 6 shows a logic circuit diagram of a fourth embodiment of signal-level shifter according to the present invention.

The fourth embodiment is also applied to the two-way logic system, like the first embodiment. Shown in FIG. 6 is the signal-level converter according to the present invention, a detailed circuit configuration of the first and the second logic circuits connected to the first and the second terminals A and B, respectively, being omitted.

The fourth embodiment of signal-level converter is a basic arrangement for supplying the first supply voltage VccA to the control terminal *OE.

A control circuit 19 is made up of an inverter involved in the first supply-voltage (VccA) system 2, which is the only difference in configuration between this fourth embodiment and the first embodiment.

Moreover, the only difference in operation between the fourth embodiment and the first embodiment is that the switching transistor 16 is controlled via the control terminal *OE at the supply-voltage (VccA) level, such as, 2.5 volts.

In detail, the supply voltage VccA is directly supplied to the gate of the N-channel transistor N1 (switching transistor 16), thus a voltage (VccA−VthN) appearing at the output terminal A or B. This output voltage is lower than that in the first embodiment, thus the voltage held by the bus-hold circuitry being increased, which requires a long switching period.

For example, in signal transfer from the terminals B to A at VccB=3.3 volts and VccA=2.5 volts, a voltage of 2.5 volts to the gate of the transistor N1 gives 2.5−1.0=1.5 volts only to the terminal A. It is thus required to increase the difference 1.0 volts by the second bus-hold circuit 18.

The output signal-level transition is illustrated in FIG. 7, such that two waveforms overlap one another for the signal level appearing at the output terminal A.

In detail, a voltage of 1.5 volts (the result of subtraction of 1.0 volts consumed by the N-channel transistor N1

(switching transistor 16) from 2.5 volts supplied to the gate of the transistor N1) is first transferred to the terminal A via the transistor N1, based on the supply-voltage-level input of 3.3 volts to the terminal B. The voltage of 1.5 volts is then raised to 2.5 volts by the bus-hold circuit 17, thus 2.5 volts appearing at the terminal A.

On the contrary, in signal transfer from the terminals A to B, the output to the terminal B via the transistor N1 is 1.5 volts only. Therefore, it is required to increase the difference 3.3−1.5=1.8 bolts by the bus-hold circuit 17, thus requiring a longer period for increase to 3.3 volts (VccB) at the terminal B than the signal transfer to the terminal A.

Nevertheless, the fourth embodiment with the bus-hold circuits 17 and 18 can provide the supply-voltage level at the output terminal B or A.

In FIG. 6, the first and the second bus-hold circuits 17 and 18 have the series connection of inverters INV1 and INV2, and INV3 and INV4, respectively, like the first embodiment. The operations of these inverters are the same as those of the first embodiment, hence the description being omitted.

The inverters may be replaced with clocked inverters or NAND-logic circuits, like the second or the third embodiments in relation to the first embodiment. Such arrangements are disclosed as fifth and sixth embodiments shown in FIGS. 9 and 10, respectively.

Figure 9:
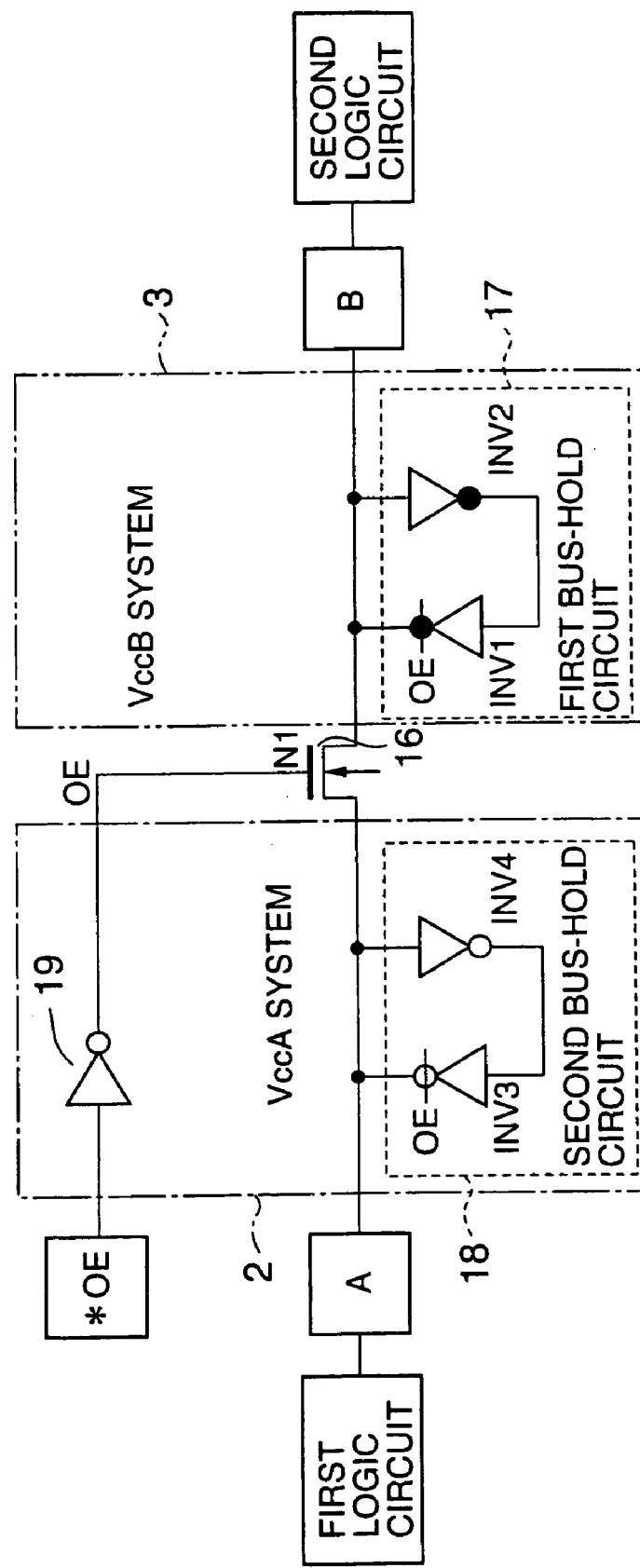
FIG. 9 shows a logic circuit diagram of a fifth embodiment of signal-level shifter according to the present invention.

The fifth embodiment of signal-level converter shown in FIG. 9 is equipped with a first bus-hold circuit 17 having a clocked inverter INV1 and an inverter INV2, and a second bus-hold circuit 18 having a clocked inverter INV3 and an inverter INV4, like the counterpart of the second embodiment shown in FIGS. 4.

The fifth embodiment is the same as the fourth embodiment shown in FIG. 6 in that the second bus-hold circuit 18 and a control circuit 19 are involved in a first supply-voltage (VccA) system 2 whereas the first bus-hold circuit 18 and a switching transistor 16 are involved in a second supply-voltage (VccB) system 3.

Figure 10:
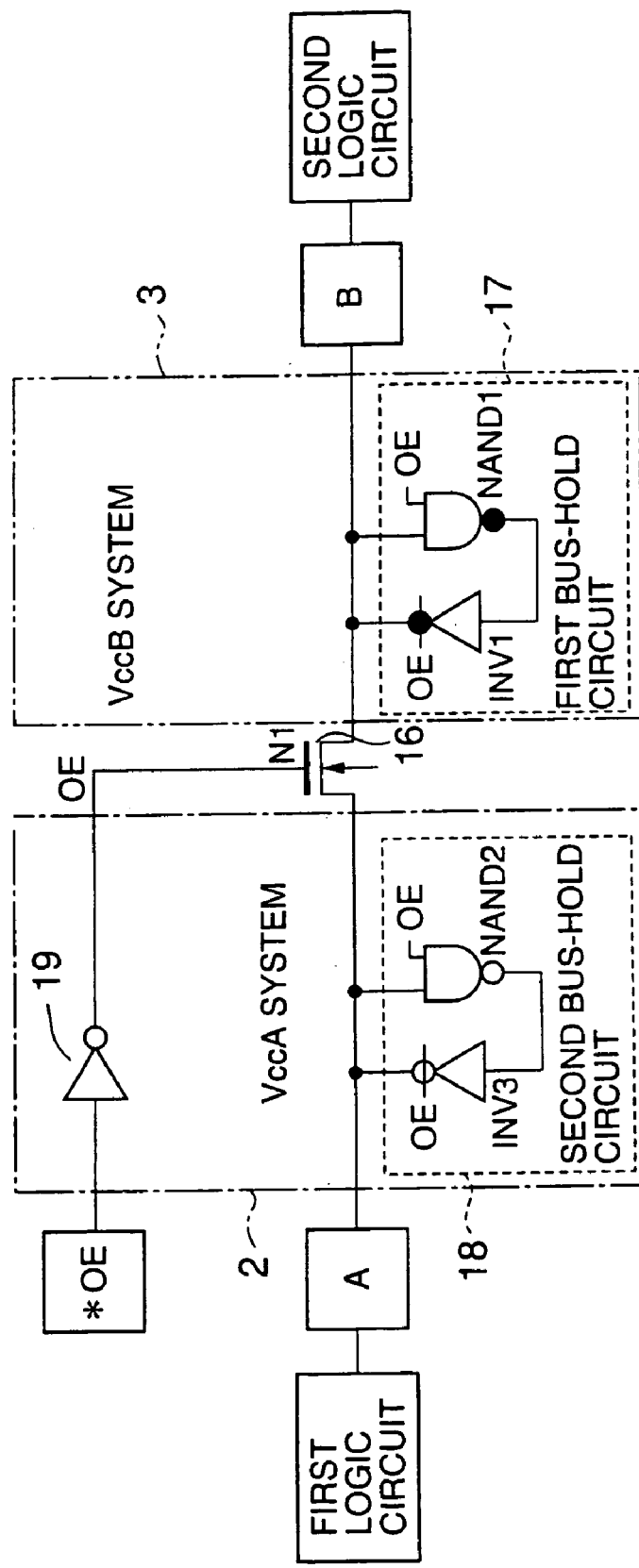
FIG. 10 shows a logic circuit diagram of a sixth embodiment of signal-level shifter according to the present invention.

The sixth embodiment of signal-level converter shown in FIG. 10 is equipped with a first bus-hold circuit 17 having a clocked inverter INV1 and a NAND-logic circuit NAND1, and a second bus-hold circuit 18 having a clocked inverter INV3 and a NAND-logic circuit NAND2, like the counterpart of the third embodiment shown in FIGS. 5.

The six embodiment is the same as the fourth embodiment shown in FIG. 6 in that the second bus-hold circuit 18 and a control circuit 19 are involved in a first supply-voltage (VccA) system 2 whereas the first bus-hold circuit 17 and a switching transistor 16 are involved in a second supply-voltage (VccB) system 3.

The purpose of the present invention is fulfilled by the fourth embodiment (FIGS. 6 to 8), the fifth embodiment (FIG. 9) and the sixth embodiment (FIG. 10).

Nevertheless, these embodiments are disadvantageous in long period of raising the first supply voltage VccA, supplied to the gate of the switching transistor 16 from the control circuit 19, to the second power supply voltage VccB, by the second bus-hold circuit 18 only.

Figure 11:
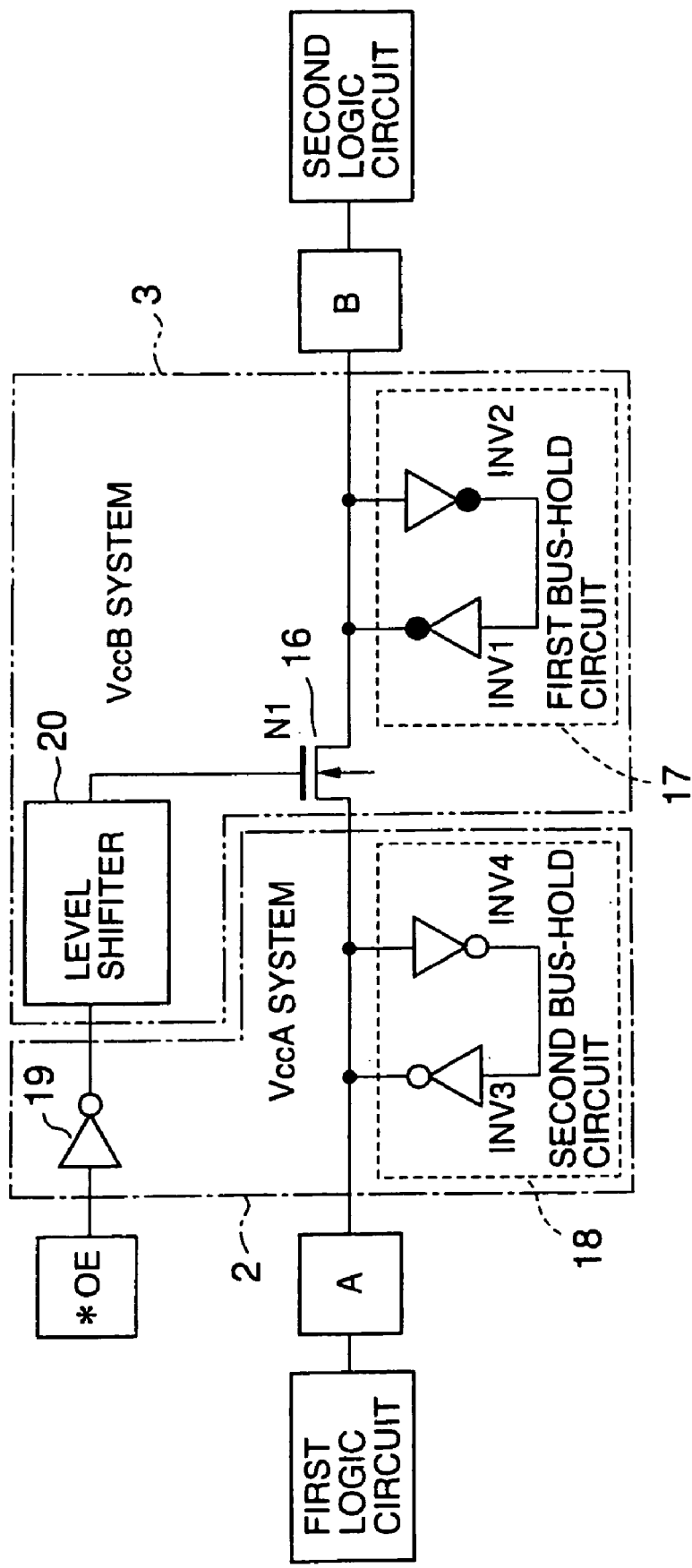
FIG. 11 shows a logic circuit diagram of a seventh embodiment of signal-level shifter according to the present invention.

Proposed for overcoming such problem is a seventh embodiment of signal-level converter shown in FIG. 11 equipped with a level shifter 20 as an internal circuitry in the second supply-voltage (VccB) system 3, in addition to the switching transistor 16 and a first bus-hold circuit 17.

In detail, the level shifter 20 (VccB) is provided between the control circuit 19 (VccA) and the gate of the switching transistor 16 (VccB), to shift the level of a control signal *OE to the second supply-voltage (VccB) level from the first supply-voltage (VccA) level.

An operation of the seventh embodiment of signal-level converter is explained briefly.

The operation of in the seventh embodiment is basically the same (in signal transfer) as the first embodiment (FIGS. 2 and 3) except that the output of the control circuit 19 is shifted from the first supply-voltage (VccA) level to the second supply-voltage (VccB) level and then supplied to the gate of the switching transistor 16.

When a signal is input via the second terminal B at the second supply-voltage (VccB) level, a signal is output via the first terminal A at the first supply-voltage (VccA) level, like shown in FIG. 2.

On the contrary, when a signal is input via the first terminal A at the first supply-voltage (VccA) level, a signal is output via the second terminal B at the second supply-voltage (VccB) level, like shown in FIG. 3.

Like the former embodiments, the seventh embodiment may not be limited to the series connection of inverters INV2 and INV2, and INV3 and INV4 for the first and the second bus-hold circuits 17 and 18, respectively. These inverters may be replaced with the series connection of clocked inverter and inverter or NAND-logic circuit.

Figure 12:
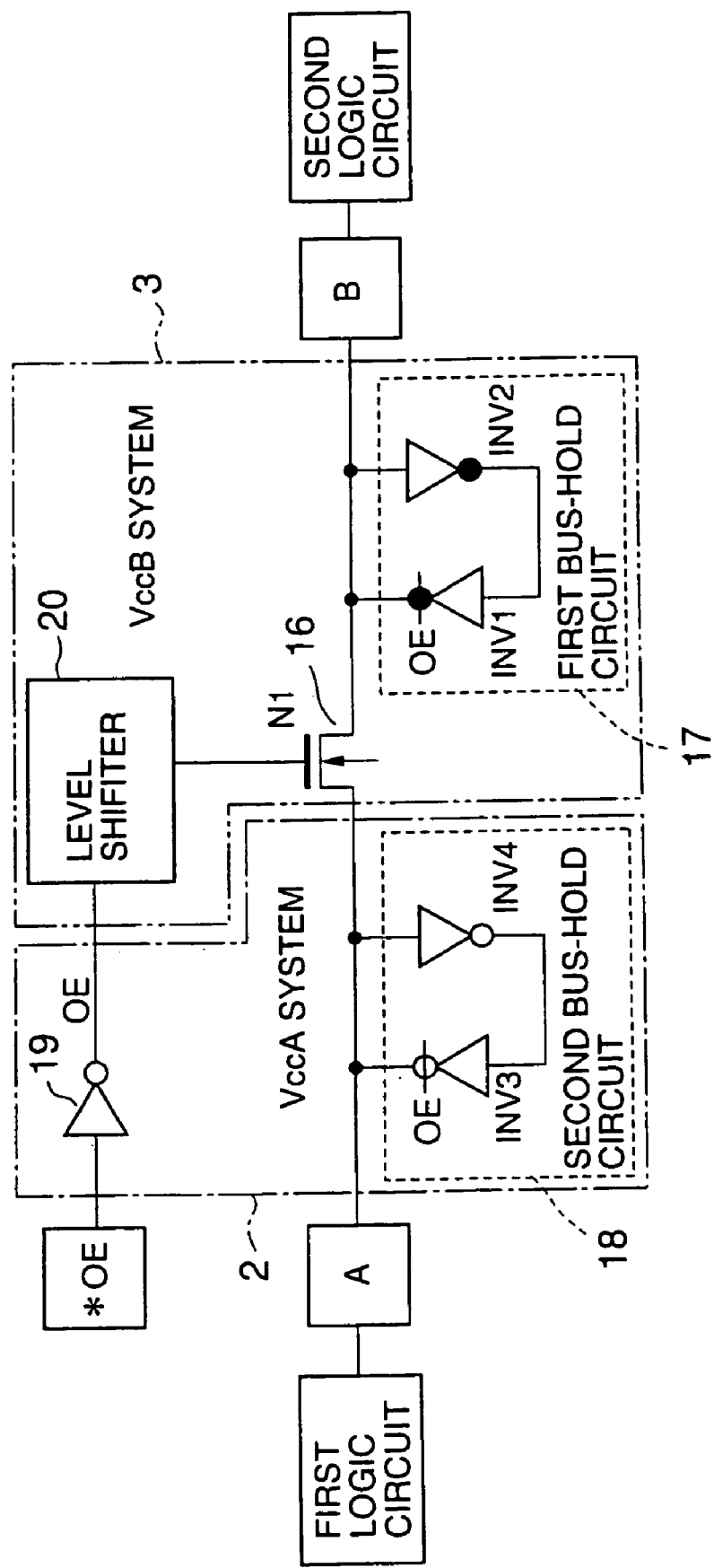
FIG. 12 shows a logic circuit diagram of an eighth embodiment of signal-level shifter according to the present invention.

An eighth embodiment of signal-level converter shown in FIG. 12 is the same as the seventh embodiment (FIG. 11) except that the former is equipped with a first bus-hold circuit 17 having a clocked inverter INV1 and an inverter INV2, and a second bus-hold circuit 18 having a clocked inverter INV3 and an inverter INV3.

Figure 13:
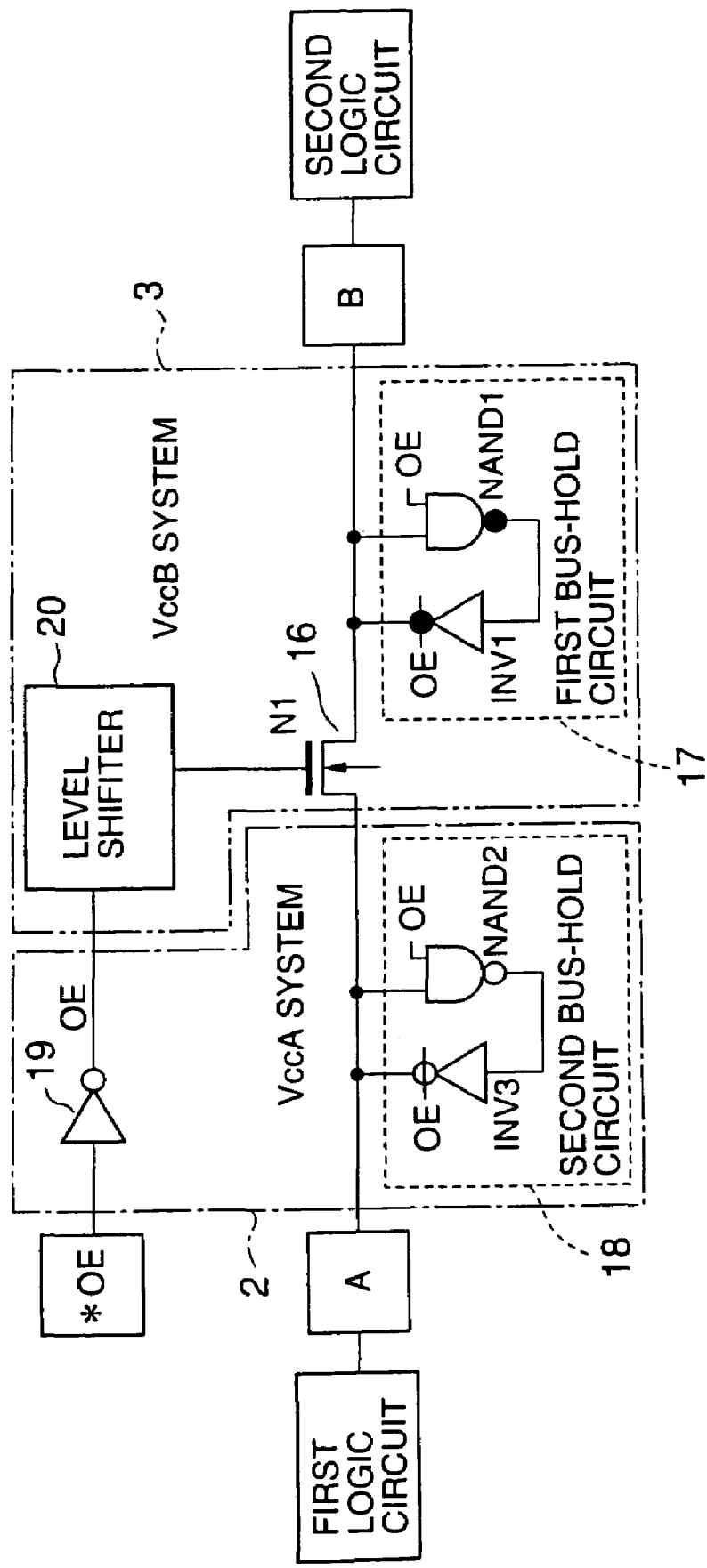
FIG. 13 shows a logic circuit diagram of a ninth embodiment of signal-level shifter according to the present invention.

A ninth embodiment of signal-level converter shown in FIG. 13 is the same as the seventh embodiment (FIG. 11) except that the former is equipped with a first bus-hold circuit 17 having a clocked inverter INV1 and a NAND-logic circuit NAND1, and a second bus-hold circuit 18 having a clocked inverter INV3 and a NAND-logic circuit NAND2.

The level shifter 20 involved in the VccB system 3 in the seventh to the ninth embodiments shifts the first supply-voltage (VccA) level of the control signal *OE output of the control circuit 19 to the second supply-voltage (VccB) level.

This level shift allows a voltage of 3.3 volts to be supplied to the gate of the transistor N1, which leads the second bus-hold circuit 18 to raise a voltage of 2.3 volts to 2.5 volts in signal output at the first terminal A whereas the first bus-hold circuit 17 to raise a voltage of 2.3 volts to 3.3 volts in signal output at the second terminal B.

In other words, the level shifter 20 lowers the signal level to be held by the bus-hold circuitry and offers the same level and period of voltage rise as the first embodiment. Whether the level shifter 20 is provided or not corresponds to the difference in the voltage level to be raised by the bus-hold circuitry and also in the period of voltage rise.

The signal-level converters in the first to the ninth embodiments require no direction control signals for switching the direction of signal transfer when signals are input in both ways. This means decrease in the number of input terminals by one in chip integrated circuitry. Thus, the present invention achieves simplified configuration for chip integrated-circuit devices having a limit on the number of terminals.

The signal-level converters in the first to the ninth embodiments are all capable of two-way signal transfer. Not only that, the present invention may be applied to one-way transfer from the first to the second terminal, or vice versa.

Disclosed next with reference to FIGS. 14 to 19 are tenth to fifteenth embodiments of signal-level converter for one-way signal transfer.

Figure 14:
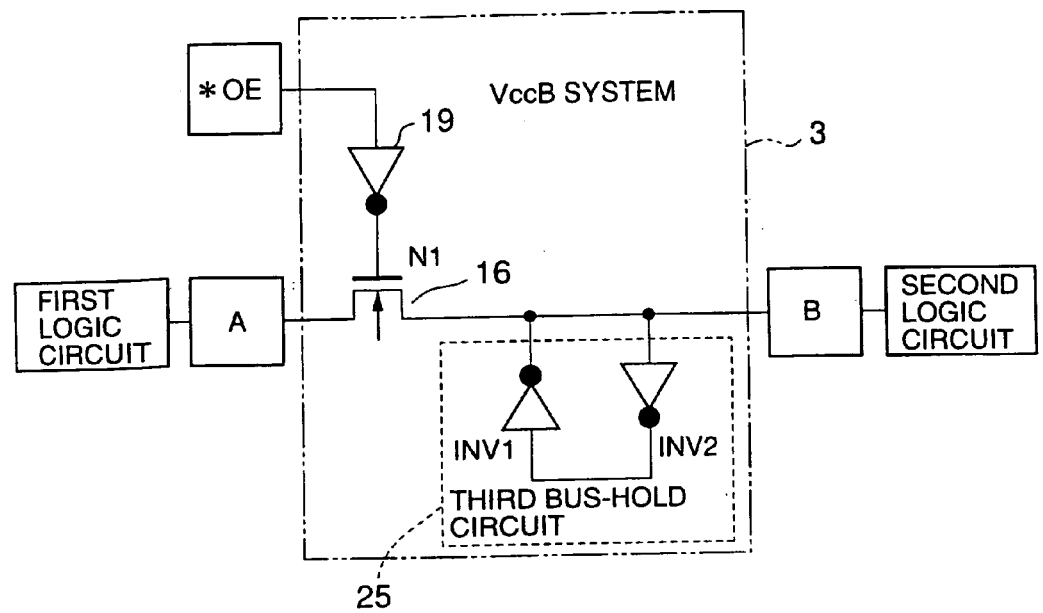
FIG. 14 shows a logic circuit diagram of a tenth embodiment of signal-level shifter according to the present invention.

The tenth embodiment of signal-level converter shown in FIG. 14 is capable of signal transfer from an input terminal A to an output terminal B.

A signal of the first supply-voltage (,VccA) level at the input terminal A is transferred via the transistor N1 and converted into a signal of the second supply-voltage (VccB) level at the output terminal B. This signal transfer is achieved while a signal of the VccB level is being supplied via the control terminal *OE, converted into a control signal OE by the control circuit 19 and then supplied to the gate of the switching transistor 16, thus the transistor 16 being turned on.

The tenth embodiment of signal-level converter is equipped with a third bus-hold circuit 25 between the switching transistor 16 and the second terminal B. The third bus-hold circuit 25 has the series connection of inverters INV1 and INV2 connected in parallel between the transistor 16 and the terminal B, like the first bus-hold circuit 17 in the first embodiment (FIG. 1).

The input of first supply-voltage (VccA)-level signal at the first terminal A is converted into a voltage of 3.3−1.0=2.3 volts at the second terminal B side or the input of the third bus-hold circuit 25.

This happens when the transistor 16 (N1) is turned on in response to a GND-level control signal at the terminal *OE. The voltage of 2.3 volts is inverted into the GND level by the inverter INV2, thus the inverter INV1 outputting a voltage of 3.3 volts.

The difference of 1.0 volts in voltage rise from 2.3 volts to 3.3 volts is raised by the inverter INV1, thus the voltage of 3.3 volts appearing at the terminal B, like shown in FIG. 3.

The inverters INV1 and INV2 may be replaced with other components in the third bus-hold circuit 25 of the tenth embodiment of signal-level converter.

Figure 15:
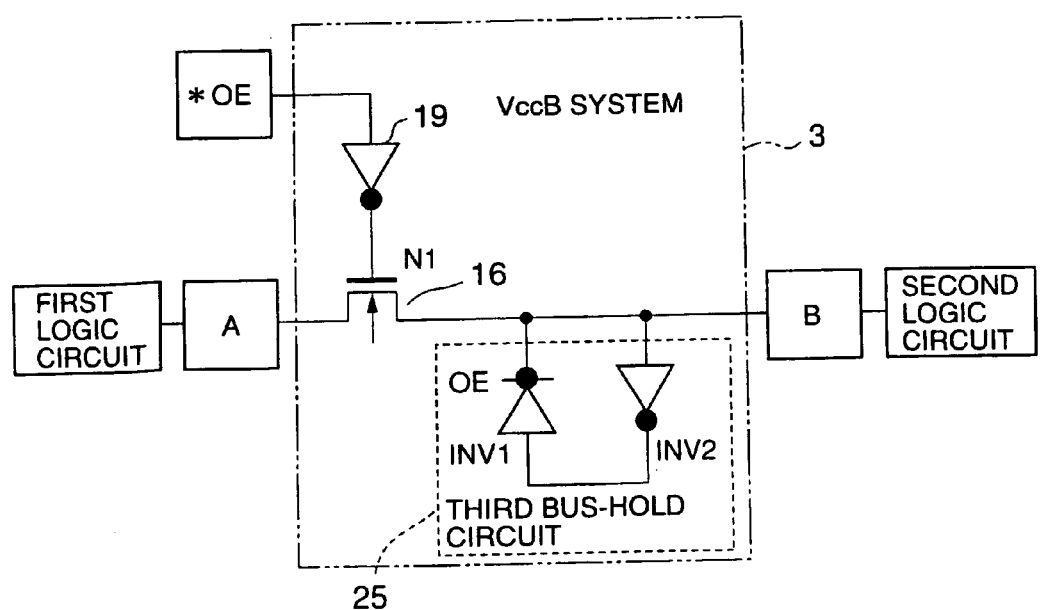
FIG. 15 shows a logic circuit diagram of an eleventh embodiment of signal-level shifter according to the present invention.

The eleventh embodiment of signal-level converter shown in FIG. 15 is equipped with a third bus-hold circuit 25 having the series connection of the clocked inverter INV1 and the inverter INV2 connected in parallel between the terminal B and the transistor 16, like the second, the fifth and the eighth embodiments.

Figure 16:
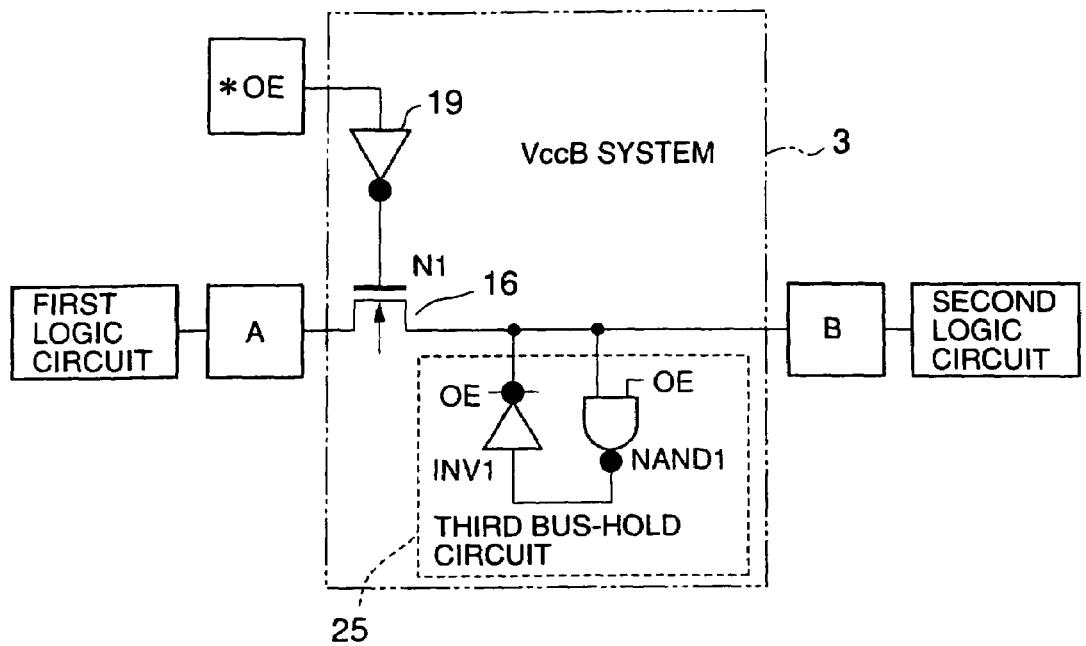
FIG. 16 shows a logic circuit diagram of a twelfth embodiment of signal-level shifter according to the present invention.

The twelfth embodiment of signal-level converter shown in FIG. 16 is equipped with a third bus-hold circuit 25 having the series connection of the clocked inverter INV1 and the NAND-logic circuit NAND1 connected in parallel between the terminal B and the transistor 16, like the third, the sixth and the ninth embodiments.

The tenth to the twelfth embodiments are applied to one-way signal transfer from the terminals A to B. Not only that, the present invention is applicable to one-way signal transfer from the terminals B to A.

Figure 17:
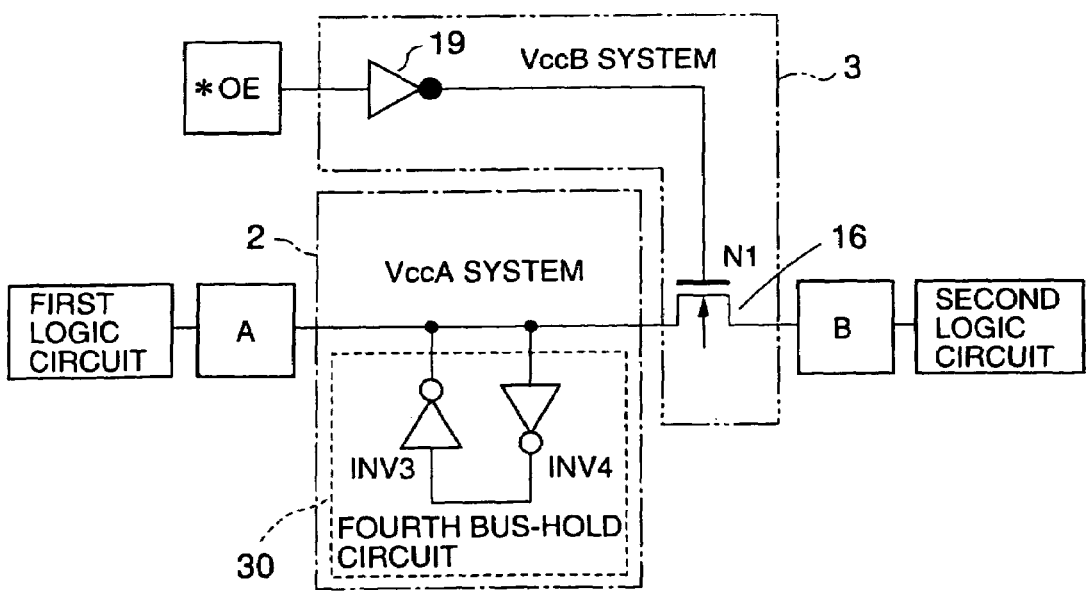
FIG. 17 shows a logic circuit diagram of a thirteenth embodiment of signal-level shifter according to the present invention.

The thirteenth embodiment of signal-level converter shown in FIG. 17 is applied to transfer of a signal of the second supply-voltage (VccB) level at the input terminal B to the output terminal A at which a signal of the first supply-voltage (VccA) level appears.

Connected in parallel between the terminal A and the switching transistor 16 is a fourth bus-hold circuit 30 having the series connection of inverters INV3 and INV4.

Signal transfer from the terminals B to A is allowed when the transistor 16 is turned on in response to the GND level at the control terminal *OE whereas inhibited when the transistor 16 is turned off in response to the second supply-voltage (VccB) level at the control terminal *OE.

In detail, a signal of the second supply-voltage (VccB) level at the second terminal B is converted into a voltage of 3.3−1.0=2.3 volts at the terminal A side of the transistor 16 while turned on in response to the GND level at the control terminal *OE.

The voltage of 2.3 volts is inverted into the GND level by the inverter INV4, and then the inverter INV3 outputting a voltage of 2.5 volts, thus a signal raised to 2.5 volts appearing at the first terminal A.

The thirteenth embodiment of signal-level converter is equipped with the fourth bus-hold circuit 30 having the series connection of inverters INV3 and INV4 connected in parallel between the terminal A and the transistor 16. The fourth bus-hold circuit 30 may, however, be made up of clocked inverter and NAND-logic circuit, etc.

Figure 18:
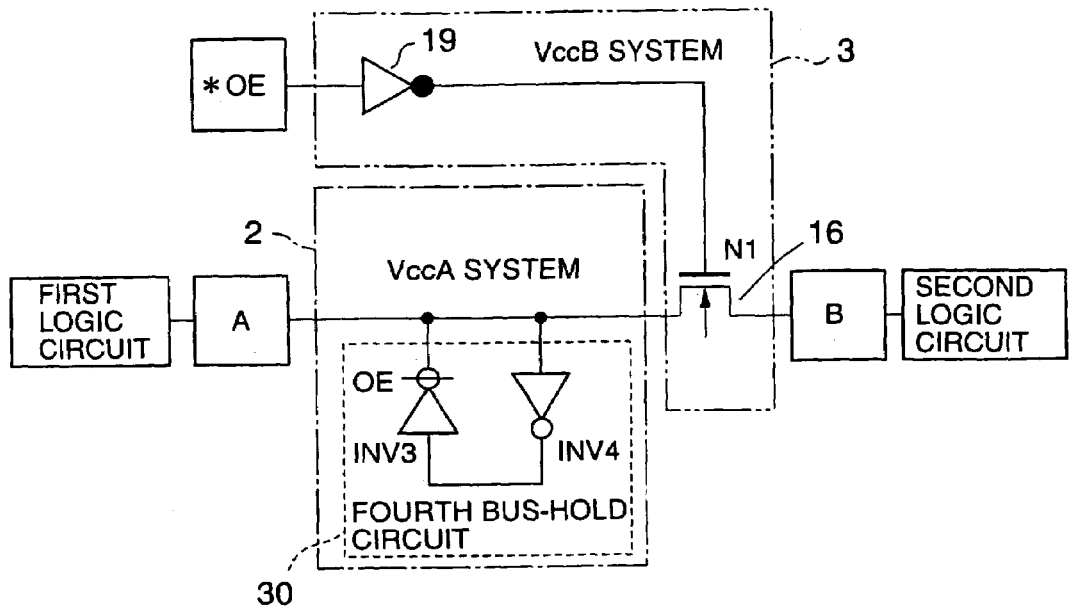
FIG. 18 shows a logic circuit diagram of a fourteenth embodiment of signal-level shifter according to the present invention.

The fourteenth embodiment of signal-level converter shown in FIG. 18 is equipped with a fourth bus-hold circuit 30 having the series connection of a clocked inverter INV3 and an inverter INV4.

The signal-level converter of the fourteenth embodiment operates like the counterpart of the thirteenth embodiment, thus having the same advantages.

Figure 19:
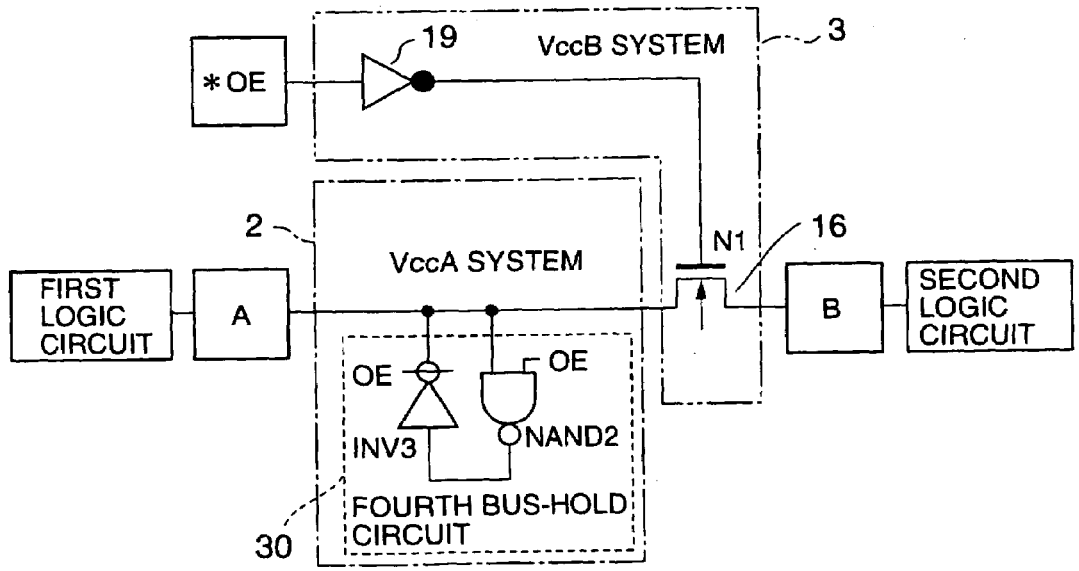
FIG. 19 shows a logic circuit diagram of a fifteenth embodiment of signal-level shifter according to the present invention.
Figure 20:
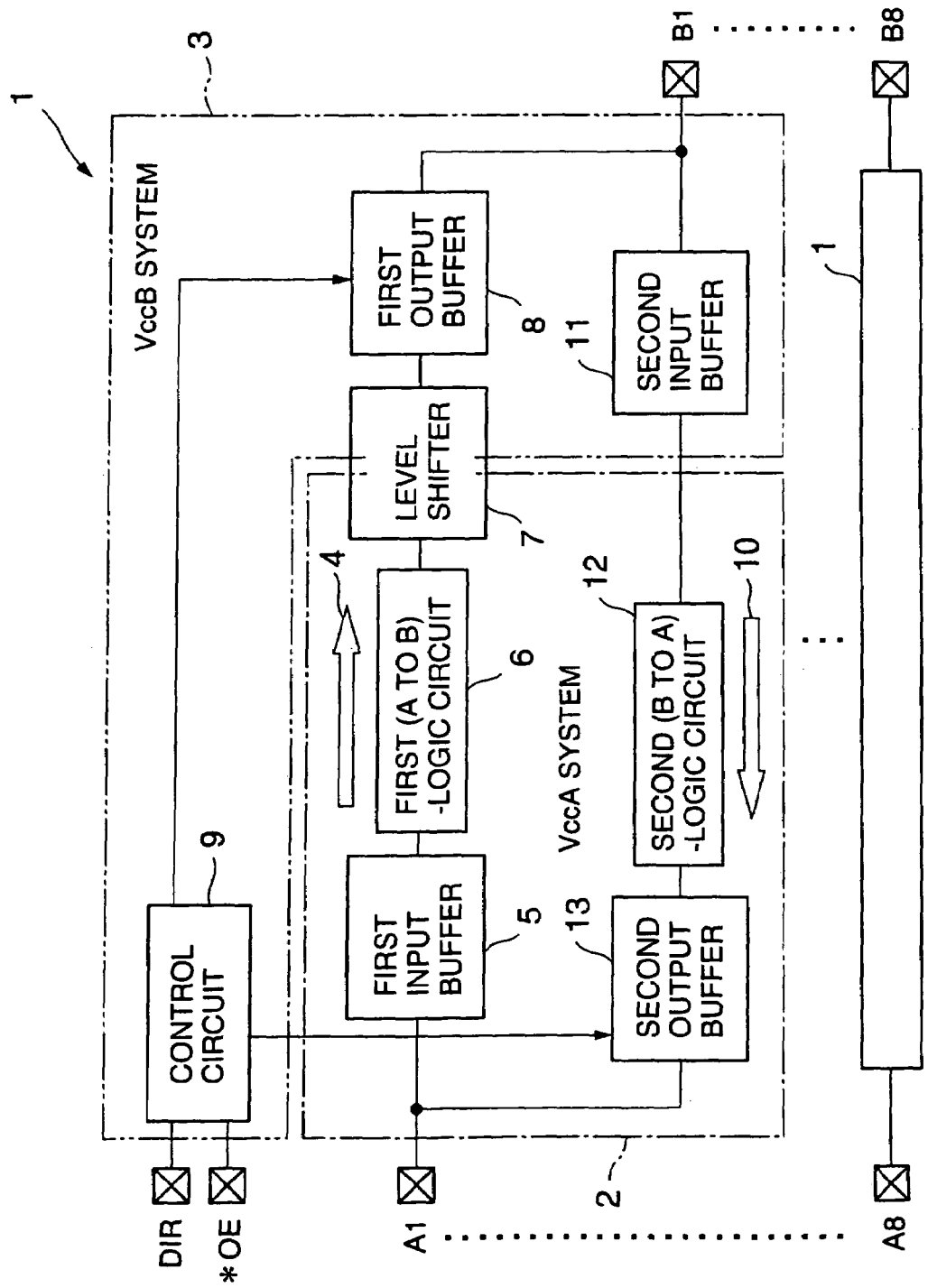
FIG. 20 shows a block diagram of a known signal-level shifter.
Figure 21:
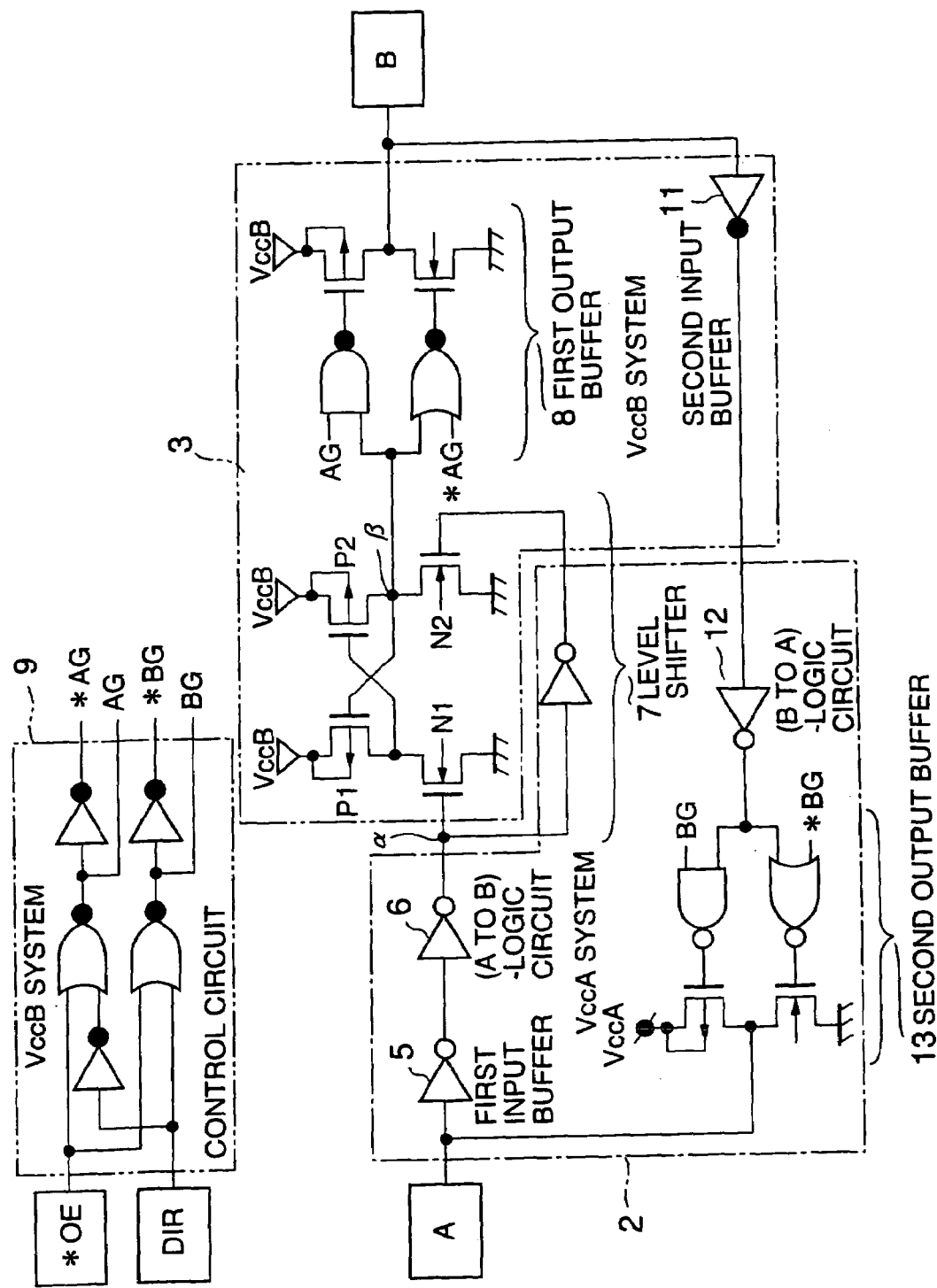
FIG. 21 shows a circuit diagram of a first known two-way signal-level shifter.
Figure 22:
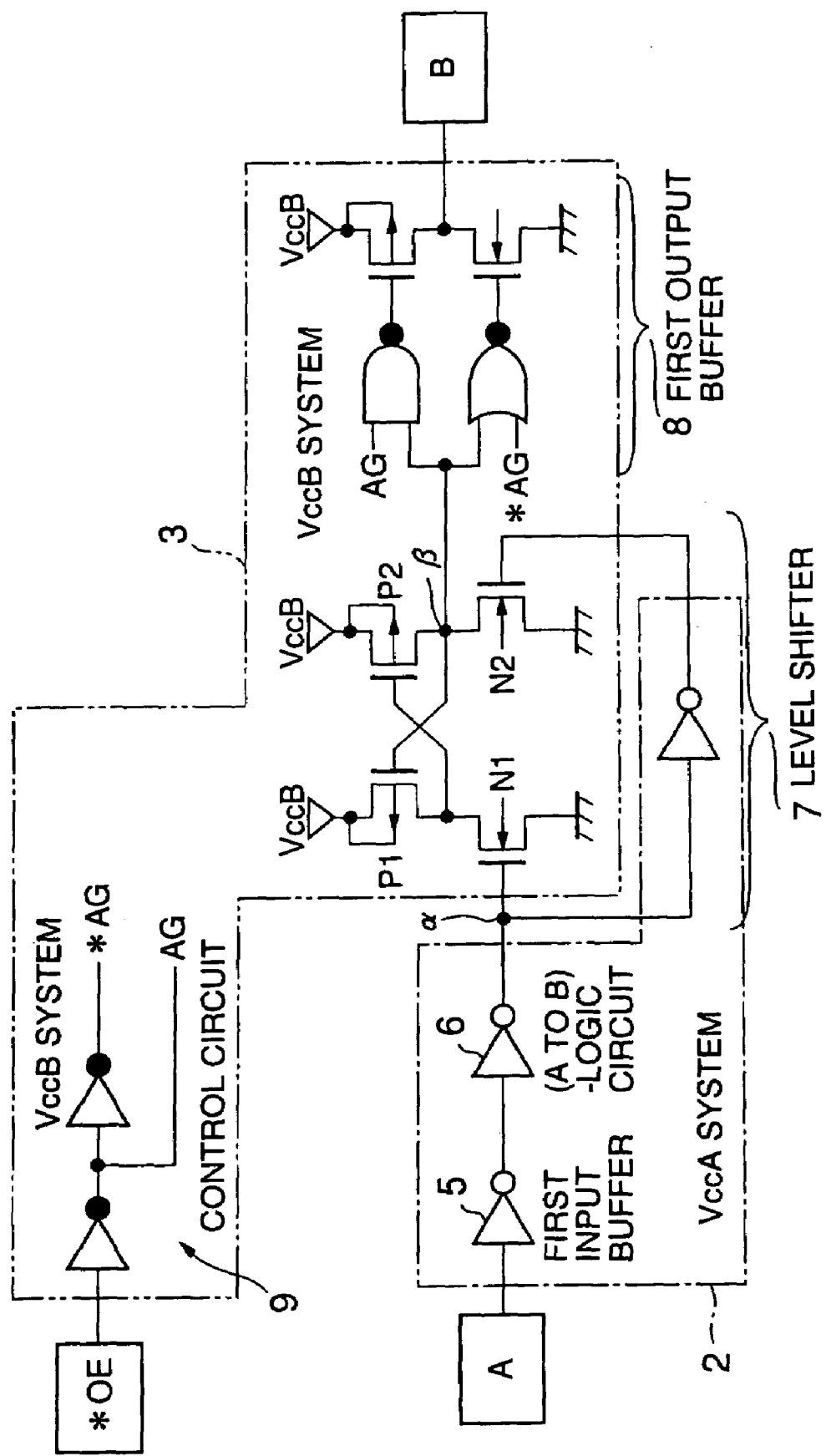
FIG. 22 shows a circuit diagram of a known one-way signal-level shifter.
Figure 23:
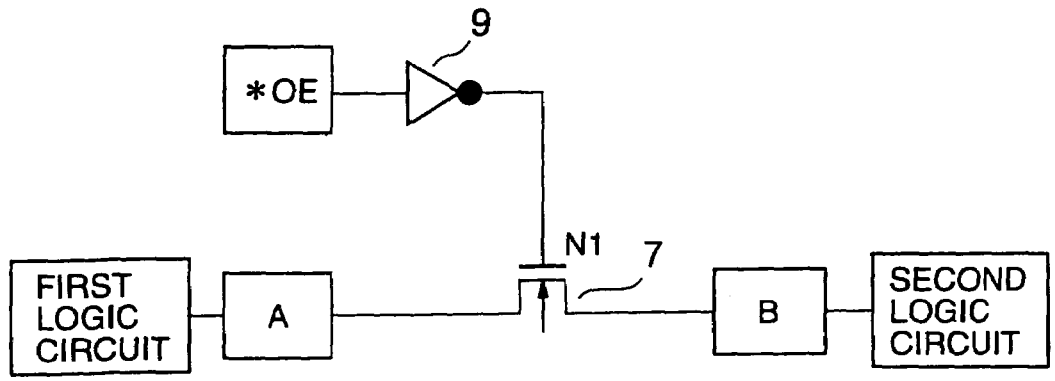
FIG. 23 shows a circuit diagram of a second known one-way logic circuit.
Figure 24:
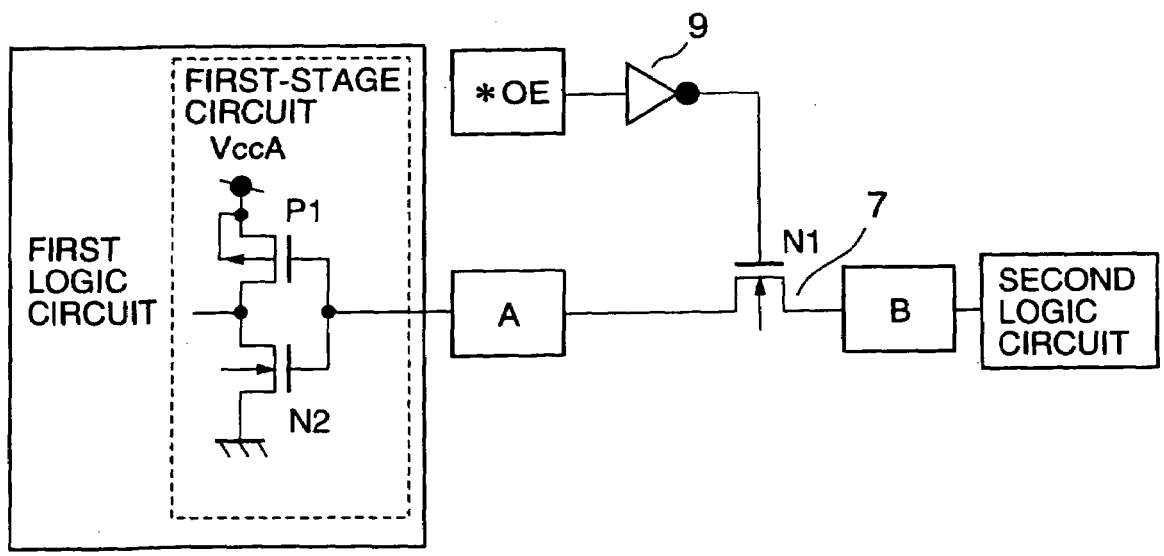
FIG. 24 shows an illustration of flow of static current to the first stage of circuitry connected to a terminal A in the known one-way logic circuit shown in FIG. 23.

The fifteenth embodiment of signal-level converter shown in FIG. 19 is equipped with a fourth bus-hold circuit 30 having the series connection of a clocked inverter INV3 and a NAND-logic NAND2.

The signal-level converter of the fifteenth embodiment operates like the counterpart of the thirteenth and the fourteenth embodiments, thus having the same advantages.

Although not shown, a control signal *OE of the first supply-voltage (VccA) level may be supplied to the control circuit 19 involved in the first supply-voltage (VccA) system 2 via the control terminal *OE in one-way signal transfer. The level shifter 20 may also be provided between the control circuit 19 and the gate of the switching transistor 16, like the eighth embodiment of signal-level converter shown in FIG. 12.

As disclosed above in detail, the signal-level converter according to the present invention has simplified configuration for conversion of supply-voltage level in one- and two-way signal transfer.

The present invention thus achieves reduction of chip size when the signal-level converter is integrated into a chip, simplified control, and also accurate level outputs at output terminals.

What is claimed is:

1. A signal-level converter provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising:

a switching transistor that forms a current passage between the first and the second terminals in response to a control signal supplied to a gate of the switching transistor;

a first bus-hold circuit, provided between the switching transistor and the second terminal, and configured to convert a voltage level of a signal transferred via the switching transistor into another voltage level at the second terminal when the first terminal is an input terminal whereas the second terminal is an output terminal, the first bus-hold circuit being capable of connecting the second terminal to the second supply voltage and a reference voltage; and a second bus-hold circuit, provided between the switching transistor and the first terminal, and configured to convert a voltage level of a signal transferred via the switching transistor into another voltage level at the first terminal when the second terminal is an input terminal whereas the first terminal is an output terminal, the second bus-hold circuit being capable of connecting the first terminal to the first supply voltage and a reference voltage.

2. The signal-level converter according to claim 1 further comprising:
a control terminal; and
a control circuit, provided between the control terminal and the gate of the switching transistor, and configured to output the control signal for operating at the second supply voltage,
wherein the gate of the switching transistor is controlled by the control signal.

3. The signal-level converter according to claim 1 further comprising:
a control terminal; and
a control circuit, provided between the control terminal and the gate of the switching transistor, and configured to output the control signal for operating at the first supply voltage,
wherein the gate of the switching transistor is controlled by the control signal.

4. The signal-level converter according to claim 3 further comprising a level shifter, provided between the control circuit and the gate of the switching transistor, and configured to shift a level of the control signal from the first supply voltage to the second supply voltage.

5. The signal-level converter according to claim 1, wherein:
the first bus-hold circuit includes a series connection of a first inverter and a second inverter connected in parallel between the switching transistor and the second terminal; and
the second bus-hold circuit includes a series connection of a third inverter and a fourth inverter connected in parallel between the switching transistor and the first terminal.

6. The signal-level converter according to claim 1, wherein the switching transistor is an N-channel transistor.

7. The signal-level converter according to claim 1, wherein the switching transistor is a P-channel transistor.

8. A signal-level converter provided between a first terminal and a second terminal, for two-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising:
a switching transistor that forms a current passage between the first and the second terminals in response to a control signal supplied to a gate of the switching transistor;
a first bus-hold circuit including a series connection of a first inverter and a second inverter connected in parallel between the switching transistor and the second terminal, the first bus-hold circuit being capable of connecting the second terminal to the second supply voltage or a reference voltage; and
a second bus-hold circuit including a series connection of a third inverter and a fourth inverter connected in parallel between the switching transistor and the first terminal, the second bus-hold circuit being capable of connecting the first terminal to the first supply voltage or a reference voltage.

9. The signal-level converter according to claim 8 further comprising:
a control terminal; and
a control circuit, provided between the control terminal and the gate of the switching transistor, and configured to output the control signal for operating at the second supply voltage,
wherein the gate of the switching transistor is controlled by the control signal.

10. The signal-level converter according to claim 8 further comprising:
a control terminal; and
a control circuit, provided between the control terminal and the gate of the switching transistor, and configured to output the control signal for operating at the first supply voltage,
wherein the gate of the switching transistor is controlled by the control signal.

11. The signal-level converter according to claim 10 further comprising a level shifter, provided between the control circuit and the gate of the switching transistor, and configured to shift a level of the control signal from the first supply voltage to the second supply voltage.

12. The signal-level converter according to claim 8, wherein the switching transistor is an N-channel transistor.

13. The signal-level converter according to claim 8, wherein the switching transistor is a P-channel transistor.

14. A signal-level converter provided between a first terminal and a second terminal, for one-way signal transfer between the terminals, the first terminal being connected to a first logic circuit operating at a first supply voltage higher than a given reference voltage, the second terminal being connected to a second logic circuit operating at a second supply voltage higher than the first supply voltage, the signal-level converter comprising:
a switching transistor that forms a current passage between the first and the second terminals in response to a control signal supplied to a gate of the switching transistor; and
a bus-hold circuit provided between the switching transistor and an output terminal that is either the first or the second terminal, the other terminal being an input terminal, and configured to convert a voltage level of a signal transferred via the switching transistor into another voltage level at the output terminal, the bus-hold circuit being capable of connecting the second terminal to the second supply voltage or a reference voltage;
a control terminal configured to supply a control signal of the first supply voltage to the gate of the switching transistor;
a control circuit, provided between the control terminal and the gate of the switching transistor, and configured to output the control signal for operating at the first supply voltage; and
a level shifter, provided between the control circuit and the gate of the switching transistor, and configured to shift a level of the control signal from the first supply voltage to the second supply voltage.

15. The signal-level converter according to claim 14, wherein the bus-hold circuit is provided between the switching transistor and the second terminal as the output terminal, the first terminal being the input terminal, and configured to convert a signal of the first supply voltage transferred via the switching transistor into another signal of the second supply voltage.

16. The signal-level converter according to claim 15, wherein the bus hold circuit includes a series connection of a first inverter and a second inverter connected in parallel between the switching transistor and the second terminal.

17. The signal-level converter according to claim 14, wherein the bus-hold circuit is configured to convert a signal of the second supply voltage transferred via the switching transistor into another signal of the first supply voltage.

18. The signal-level converter according to claim 17, wherein the bus hold circuit includes a series connection of a first inverter and a second inverter connected in parallel between the switching transistor and the first terminal.

19. The signal-level converter according to claim 14, wherein
the bus-hold circuit includes a series connection of a first inverter and a second inverter connected in parallel between the switching transistor and the output terminal.

* * * * *